(12) United States Patent
Zang et al.

(10) Patent No.: US 10,134,739 B1
(45) Date of Patent: Nov. 20, 2018

(54) MEMORY ARRAY WITH BURIED BITLINES BELOW VERTICAL FIELD EFFECT TRANSISTORS OF MEMORY CELLS AND A METHOD OF FORMING THE MEMORY ARRAY

(71) Applicant: GLOBALFOUNDRIES INC., Grand Cayman (KY)

(72) Inventors: Hui Zang, Guilderland, NY (US); Jerome Ciavatti, Mechanicville, NY (US); Rinus Tek Po Lee, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/661,058

(22) Filed: Jul. 27, 2017

(51) Int. Cl.
*H01L 29/66* (2006.01)
*H01L 29/78* (2006.01)
(Continued)

(52) U.S. Cl.
CPC .. *H01L 27/10814* (2013.01); *H01L 27/10873* (2013.01); *H01L 29/0676* (2013.01);
(Continued)

(58) Field of Classification Search
CPC ............. H01L 27/108; H01L 27/10805; H01L 27/10814; H01L 27/10847; H01L 27/1085; H01L 27/10852; H01L 27/10855; H01L 27/10885; H01L 27/10873; H01L 29/1037; H01L 29/0676; H01L 29/42392; H01L 29/66666; H01L 29/66787; H01L 29/7827;
(Continued)

(56) References Cited

U.S. PATENT DOCUMENTS 6,077,745 A   6/2000  Burns, Jr. et al.
6,423,641 B1* 7/2002  Gau ................... H01L 21/76885
                                           257/E21.507
(Continued)

OTHER PUBLICATIONS

Changyeol Lee, "DRAM Life Extension Challenge and Response," SK Hynix, IEDM Short Course, Dec. 6, 2015, pp. 1-74.
(Continued)

*Primary Examiner* — Natalia Gondarenko
(74) *Attorney, Agent, or Firm* — Gibb & Riley, LLC; Anthony J. Canale

(57) ABSTRACT

Disclosed is a structure wherein lower source/drain regions of vertical field effect transistors (VFETs) of memory cells in a memory array are aligned above and electrically connected to buried bitlines. Each cell includes a VFET with a lower source/drain region, an upper source/drain region and at least one channel region extending vertically between the source/drain regions. The lower source/drain region is above and immediately adjacent to a buried bitline, which has the same or a narrower width than the lower source/drain region and which includes a pair of bitline sections and a semiconductor region positioned laterally between the sections. The semiconductor region is made of a different semiconductor material than the lower source/drain region. Also disclosed is a method that ensures that bitlines of a desired critical dimension can be achieved and that allows for size scaling of the memory array with minimal bitline coupling.

18 Claims, 31 Drawing Sheets

(51) Int. Cl.
*H01L 27/108* (2006.01)
*H01L 27/115* (2017.01)
*H01L 29/06* (2006.01)
*H01L 29/10* (2006.01)
*H01L 21/8242* (2006.01)
*H01L 21/336* (2006.01)
*H01L 21/28* (2006.01)

(52) U.S. Cl.
CPC ...... *H01L 29/1037* (2013.01); *H01L 29/6656* (2013.01); *H01L 29/66666* (2013.01); *H01L 29/7827* (2013.01)

(58) Field of Classification Search
CPC ......... H01L 29/78639; H01L 29/78642; H01L 29/78651; H01L 2924/10271; H01L 2924/13087; H01L 2924/1436; H01L 29/7926; H01L 29/6656; H01L 27/0924; H01L 27/092; H01L 27/088; H01L 27/0886; H01L 27/11517; H01L 27/1156; H01L 27/12; H01L 21/02532; H01L 21/2652; H01L 21/823412; H01L 21/22; H01L 21/225; H01L 21/2256; H01L 21/2253; H01L 21/823814; H01L 21/84; H01L 21/28176; H01L 21/2818; H01L 21/28273; H01L 21/823807; H01L 21/8234; H01L 21/823425; H01L 21/8238; H01L 21/823821; H01L 29/0878; H01L 29/42324–29/42336; H01L 29/66; H01L 29/66636; H01L 29/6659; H01L 29/66795; H01L 29/66825; H01L 29/66477; H01L 29/78618; H01L 29/78; H01L 29/7883; H01L 29/785; H01L 29/788–29/7889

USPC ................ 257/329, 384, 202, 210, 296–300; 438/197, 674, 678, 682, 585
See application file for complete search history.

(56) References Cited

U.S. PATENT DOCUMENTS

| | | | |
|---|---|---|---|
| 7,705,386 B2 | 4/2010 | Cheng et al. | |
| 7,923,337 B2 | 4/2011 | Chang et al. | |
| 8,518,774 B2 | 8/2013 | Fazan | |
| 9,368,502 B2 | 6/2016 | Chang et al. | |
| 9,627,478 B1 | 4/2017 | Leobandung | |
| 2006/0081884 A1* | 4/2006 | Abbott | H01L 27/10841 257/208 |
| 2007/0246783 A1* | 10/2007 | Moon | H01L 27/10876 257/384 |
| 2007/0295995 A1 | 12/2007 | Yun et al. | |
| 2008/0173937 A1* | 7/2008 | Chung | H01L 29/0657 257/329 |
| 2012/0193696 A1* | 8/2012 | Fukushima | H01L 21/76847 257/306 |
| 2014/0061850 A1* | 3/2014 | Cho | H01L 27/0203 257/506 |
| 2015/0236164 A1 | 8/2015 | Sandhu | |
| 2017/0365712 A1* | 12/2017 | Bu | H01L 29/7827 |

OTHER PUBLICATIONS

Guerfi et al., "Vertical Silicon Nanowire Field Effect Transistors with Nanoscale Gate-All-Around", Guerfi and Larrieu Nanoscale Research Letters, Université de Toulouse, CNRS, 7 av. Roche, Toulouse 31077, France, pp. 2-7.

* cited by examiner

MEMORY ARRAY WITH BURIED BITLINES BELOW VERTICAL FIELD EFFECT TRANSISTORS OF MEMORY CELLS AND A METHOD OF FORMING THE MEMORY ARRAY

BACKGROUND

Field of the Invention

The present invention relates to memory arrays. More particularly, the present invention relates to a memory array having buried bitlines connected to lower source/drain regions of vertical field effect transistors (VFETs) of memory cells and a method of forming the memory array that allows for size scaling with minimal coupling between adjacent buried bitlines (BLs).

Description of the Related Art

Integrated circuit (IC) design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel. It should be noted that, because the semiconductor fin is so thin, any field effects exhibited at the top surface are insignificant (i.e., negligible).

Recently, vertical field effect transistors (VFETs), such as vertical fin-type field effect transistors (VFINFETs) and vertical nanowire-type field effect transistors (VNWFETs), have been developed, wherein the device components are stacked vertically on a substrate as opposed to being positioned side by side across a substrate in order to allow for increased device density (i.e., a greater number of devices within a given area). Specifically, a VFET typically includes a lower source/drain region in a substrate, a semiconductor fin or one or more nanowires extending upward from the lower source/drain region, and an upper source/drain region that is epitaxially grown on the top surface of the semiconductor fin or the nanowire(s). A gate structure (e.g., a replacement metal gate (RMG)) laterally surrounds the semiconductor fin or nanowire(s) and is electrically isolated from the lower source/drain region and the upper source/drain region by lower and upper spacer layers, respectively.

Memory cells (e.g., embedded dynamic random access memory (eDRAM) cells, SRAM cells, etc.) can incorporate such vertical VFETs in order to minimize each cell footprint and, thereby minimize chip area required for an entire memory array that incorporates the memory cells. However, practical issues related to incorporating memory cells with VFETs into a memory array and, particularly, to connecting memory array bitlines to the lower source/drain regions of the VFETs in the memory cells include limitations associated with lithographic patterning of the bitlines and achieving a desired critical dimension and also a tradeoff between size scaling and coupling between adjacent bitlines.

SUMMARY

In view of the foregoing, disclosed herein are embodiments of a memory array wherein lower source/drain regions of vertical field effect transistors (VFETs) of memory cells in the array are aligned above and electrically connected to buried bitlines. Specifically, each memory cell can include a VFET with a lower source/drain (S/D) region, an upper S/D region and at least one channel region extending vertically between the lower and upper S/D regions. The lower S/D region can be above and immediately adjacent to a buried bitline (BL). This buried BL can have the same width or a narrower width than the lower S/D region. Additionally, this buried BL can include a pair of essentially parallel, elongated, BL sections that extend the length of the BL and a semiconductor region positioned laterally between the BL sections. The semiconductor region can be made of a different semiconductor material than the lower S/D region. Also disclosed herein are embodiments of a method of forming such a memory array. In this method, because the buried BLs are not lithographically patterned, the desired critical dimension for the BLs can be achieved. Additionally, because the buried BLs are below the lower S/D regions as opposed to beside the lower S/D regions, size scaling of the memory array can occur with minimal BL coupling.

More particularly, disclosed herein are embodiments of a memory array. This memory array can include, among other components, a substrate, a buried bitline (BL) above the substrate, and a memory cell above the buried BL. The buried BL can have a first surface adjacent to the substrate and a second surface opposite the first surface. The buried BL can include a pair of essentially parallel, elongated, BL sections that extend the length of the BL and a semiconductor region positioned laterally between the BL sections. The memory cell can include, among other components, a vertical field effect transistor (VFET). This VFET can include a first source/drain (S/D) region, a second S/D region, and a channel region between the first S/D region and the second S/D region. The first S/D region can be immediately adjacent to the second surface of the buried BL opposite the substrate (i.e., the buried BL can be stacked between the substrate and the first S/D region). The first S/D region can have a first width and the buried BL below can have a second width that is equal to or less than the first width. Additionally, the first S/D region can be made of a first semiconductor material (e.g., silicon) and the semiconductor region of the buried BL can be made of a second semiconductor material (e.g., silicon germanium) that is different from the first semiconductor material. It should be noted that interlayer dielectric (ILD) material can be positioned laterally adjacent to opposing sides of the buried BL and opposing sides of the first S/D region. Optionally, airgaps can be located either within the ILD material adjacent to the buried BL or between the sidewalls of the buried BL and the ILD material. The channel region can be above the first S/D region and can be in the form of a semiconductor fin or semiconductor nanowire. The second S/D region can be above the channel region. Thus, in the above described memory array, the buried BL and the first S/D region, the channel region and the second S/D region of the memory cell are stacked vertically above the substrate.

Also disclosed herein are embodiments of a method of forming the above-described memory array.

Generally, in the method embodiments, a first source/drain (S/D) region for a vertical field effect transistor (VFET) of a memory cell of a memory array can be formed such that it is above and immediately adjacent to a semiconductor region, which is located on a top surface of a substrate. The first S/D region and the semiconductor region can have essentially equal widths (e.g., such that the sidewalls of the semiconductor region and the first S/D region are essentially vertically aligned). Additionally, the first S/D region can be made of a first semiconductor material (e.g., silicon) and the semiconductor region can be made of a second semiconductor material (e.g., silicon germanium) that is different from the first semiconductor material. Subsequently, the sidewalls of the semiconductor region can be selectively etched back to narrow the semiconductor region (i.e., so that the semiconductor region is narrower than the first S/D region), thereby creating cavities below the first S/D region and positioned laterally adjacent to the semiconductor region. A conductor can be deposited to fill the cavities. Then, an etch process can be performed to remove any portion of the conductor that extends laterally beyond the cavities, thereby creating a buried bitline (BL) below the first S/D region. This buried BL will include a first BL section, a second BL section and the semiconductor region positioned laterally between the first BL section and the second BL section. In the resulting structure, the first S/D region can have a first width and the buried BL can have a second width. The second width can be essentially equal to the first width. Alternatively, the sidewalls of the buried BL can be etched back such that the first width of the first S/D region is greater than the second width of the buried BL. A blanket layer of interlayer dielectric (ILD) material can subsequently be deposited such that it is positioned laterally adjacent to opposing sides of the buried BL and the first S/D region. Optionally, this blanket layer of ILD material can be deposited such that airgaps are formed either within the ILD material adjacent to the buried BL or between the sidewalls of the buried BL and the ILD material. Additional processing can then be performed in order to complete the VFET, other components of the memory cell, other components of the memory array, etc.

One specific embodiment of the method of forming the above-described memory array can include forming a semiconductor layer on a substrate and an additional semiconductor layer on the semiconductor layer. The additional semiconductor layer can be a first semiconductor material (e.g., silicon) and the semiconductor layer can be a second semiconductor material (e.g., silicon germanium) that is different from the first semiconductor material. A semiconductor body (e.g., a semiconductor fin or semiconductor nanowire (NW)) can be patterned into an upper portion of the additional semiconductor layer above a lower portion of the additional semiconductor layer. The remaining lower portion of the additional semiconductor layer can then be doped for a first source/drain (S/D) region of a vertical field effect transistor (VFET) of a memory cell of a memory array.

A sacrificial layer can be deposited over the partially completed structure and a mask section can be formed on the sacrificial layer such that it is aligned above and wider than the semiconductor body. After formation of the mask section, an anisotropic etch process can be performed in order to form trenches that extend essentially vertically through the sacrificial layer, through the lower portion of the additional semiconductor layer, through the semiconductor layer and into the substrate. This anisotropic etch process will shape (i.e., define the shape of, form, pattern, etc.) the first S/D region in the lower portion of the additional semiconductor layer and will further shape a semiconductor region in the semiconductor layer below such that the first S/D region and the semiconductor region have essentially equal widths.

Subsequently, an isotropic etch process can be performed in order to selectively etch back sidewalls of the semiconductor region in order to narrow the semiconductor region (i.e., such that the semiconductor region is narrower than the first S/D region), thereby creating cavities below the first S/D region and positioned laterally adjacent to the semiconductor region. The mask section can then be removed and a conductor can be deposited so as to fill the cavities. Following deposition of the conductor, an additional anisotropic etch process can be performed to form additional trenches extending vertically through the conductor. This additional anisotropic etch process can remove any portion of the conductor that extends laterally beyond the cavities and can thereby shape (i.e., define the shape of, form, pattern, etc.) a buried bitline (BL) for the memory array below the first S/D region. This buried bitline will include a first BL section, a second BL section and the semiconductor region positioned laterally between the first BL section and the second BL section. In the resulting structure, the first S/D region can have a first width and the buried BL can have a second width. The second width of the buried BL can be essentially equal to the first width of the first S/D region. Alternatively, the sidewalls of the buried BL can further be etched back such that the first width of the first S/D region is greater than the second width of the buried BL.

A blanket layer of interlayer dielectric (ILD) material can subsequently be deposited such that it fills the additional trenches and, thus, such that it is positioned laterally adjacent to opposing sides of the buried BL and opposing sides of the first S/D region. Optionally, this blanket layer of ILD material can be deposited such that airgaps are formed either within the ILD material adjacent to the buried BL or between the sidewalls of the buried BL and the ILD material. Additional processing can then be performed in order to complete the VFET, other components of the memory cell, other components of the memory array, etc.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
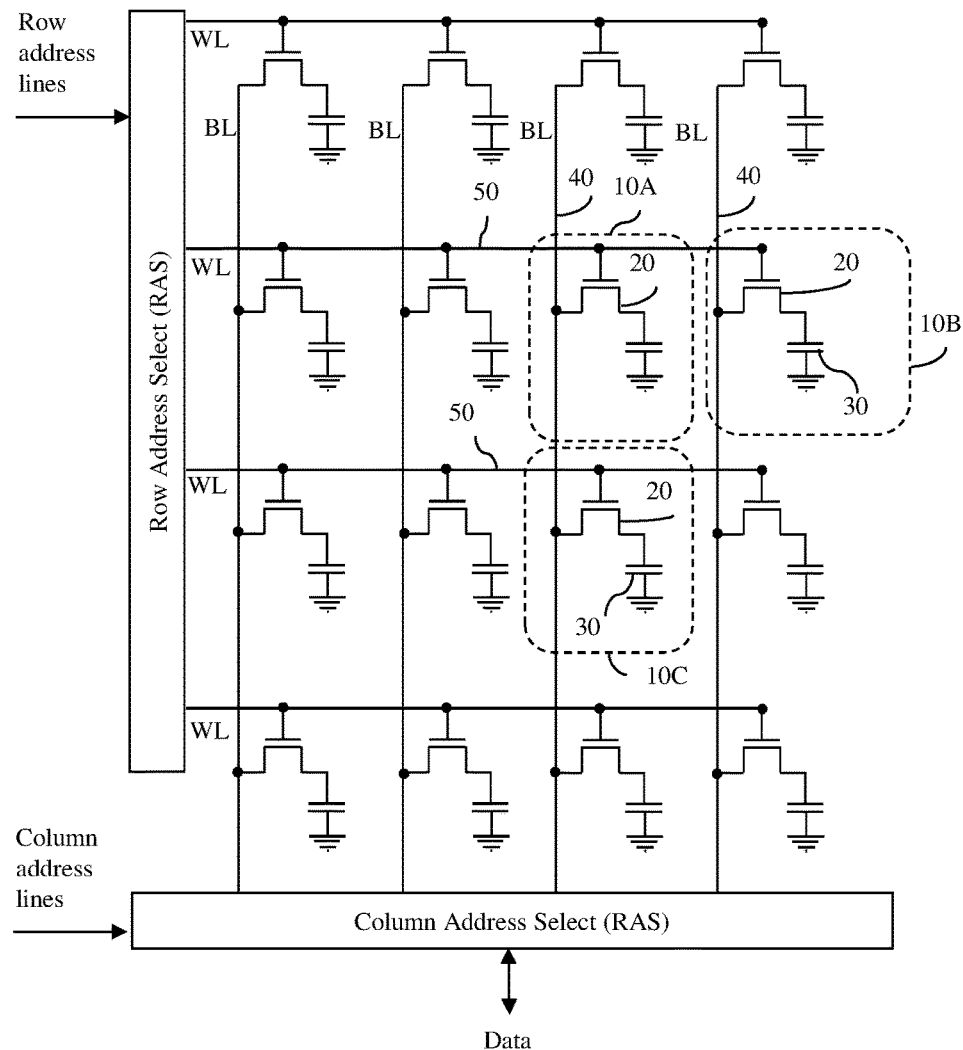
FIG. 1 is a high-level schematic diagram illustrating an exemplary dynamic random access memory (DRAM) array.

As mentioned above, memory cells (e.g., embedded dynamic random access memory (eDRAM) cells, SRAM cells, etc.) can incorporate such vertical VFETs in order to minimize each cell footprint and, thereby minimize chip area required for an entire memory array that incorporates the memory cells. However, practical issues related to incorporating memory cells with VFETs into a memory array and, particularly, to connecting memory array bitlines to the lower source/drain regions of the VFETs in the memory cells include limitations associated with lithographic patterning of the bitlines and achieving a desired critical dimension and also a tradeoff between size scaling and coupling between adjacent bitlines.

For example, trenches for bitlines can be lithographically patterned and etched such that the lower source/drain region of the VFET of a memory cell will be positioned laterally between and immediately adjacent to a pair of bitlines. The challenge, however, is whether the desired critical dimension of the bitlines can be achieved using a lithographic patterning process. Additionally, the spacing between adjacent VFETs must be sufficiently large to avoid coupling between adjacent bitlines. One solution is to lithographically pattern and etch the trenches for bitlines such that the lower source/drain region of the VFET of a memory cell will be positioned laterally immediately adjacent to a single bitline and such that all bitlines will be on the same side of all VFETs. While this solution reduces bitline coupling, achieving the desired critical dimension using lithographic patterning is still an issue.

In view of the foregoing, disclosed herein are embodiments of a memory array wherein lower source/drain regions of vertical field effect transistors (VFETs) of memory cells in the array are aligned above and electrically connected to buried bitlines. Specifically, each memory cell can include a VFET with a lower source/drain (S/D) region, an upper S/D region and at least one channel region extending vertically between the lower and upper S/D regions. The lower S/D region can be immediately adjacent to and center-aligned above a buried bitline (BL). This buried BL can have the same width or a narrower width than the lower S/D region. Additionally, this buried BL can include a pair of essentially parallel, elongated, BL sections that extend the length of the BL and a semiconductor region positioned laterally between the parallel BL sections. The semiconductor region can be made of a different semiconductor material than the lower S/D region. Also disclosed herein are embodiments of a method of forming such a memory array. In this method, because the buried BLs are not lithographically patterned, the desired critical dimension for the BLs can be achieved. Additionally, because the buried BLs are below the lower S/D regions as opposed to beside the lower S/D regions, size scaling of the memory array can occur with minimal BL coupling.

More particularly, disclosed herein are embodiments of a memory array and a method of forming the memory array. The memory array includes multiple memory cells arranged in columns and rows and each memory cell includes at least one vertical field effect transistor (VFET) electrically connected to a buried bitline. For purpose of illustration, the disclosed memory array is described below and illustrated in the Figures as being a dynamic random access memory (DRAM) array. However, it should be understood that, alternatively, the novel features could be incorporated into any memory array, wherein the memory cells are arranged in columns and rows and each memory cell includes at least one vertical field effect transistor (VFET) electrically connected to a buried bitline.

FIG. 1 is a high-level schematic diagram illustrating an exemplary DRAM array. This DRAM array includes multiple DRAM cells (e.g., 10A, 10B, 10C, etc.) that are arranged in columns and rows with the DRAM cells in the different rows connected to different wordlines (WLs) 50, respectively, and with the memory cells in different columns connected to different bitlines (BLs), respectively. Specifically, each DRAM cell (e.g., 10A, 10B, 10C, etc.) includes a vertical field effect transistor (VFET) 20 and a capacitor 30. Each VFET 20 in each DRAM cell has a first source/drain (S/D) region that is connected to a buried BL 40, a gate that is connected to a WL 50 and a second S/D region that is connected to the capacitor 30. Each capacitor 30 in each DRAM cell is electrically connected between the second S/D region of the VFET 20 and ground. As illustrated, the gates of the VFETs of all DRAM cells in a given row are electrically connected to the same WL 50. Furthermore, the first S/D regions of the VFETs of all DRAM cells in a given column are connected to the same BL 40 (i.e., the memory cells in the given column will have a shared BL). Additional components of the DRAM array include, but are not limited to, the row address select (RAS) logic connected to each WL and the column address select (CAS) logic connected to each BL. Reading and writing operation of such a DRAM array is well known in the art and, thus, the details of such operation have been omitted from this specification in order to allow the reader to focus on the salient aspects of the disclosed embodiments.

Figure 2A:
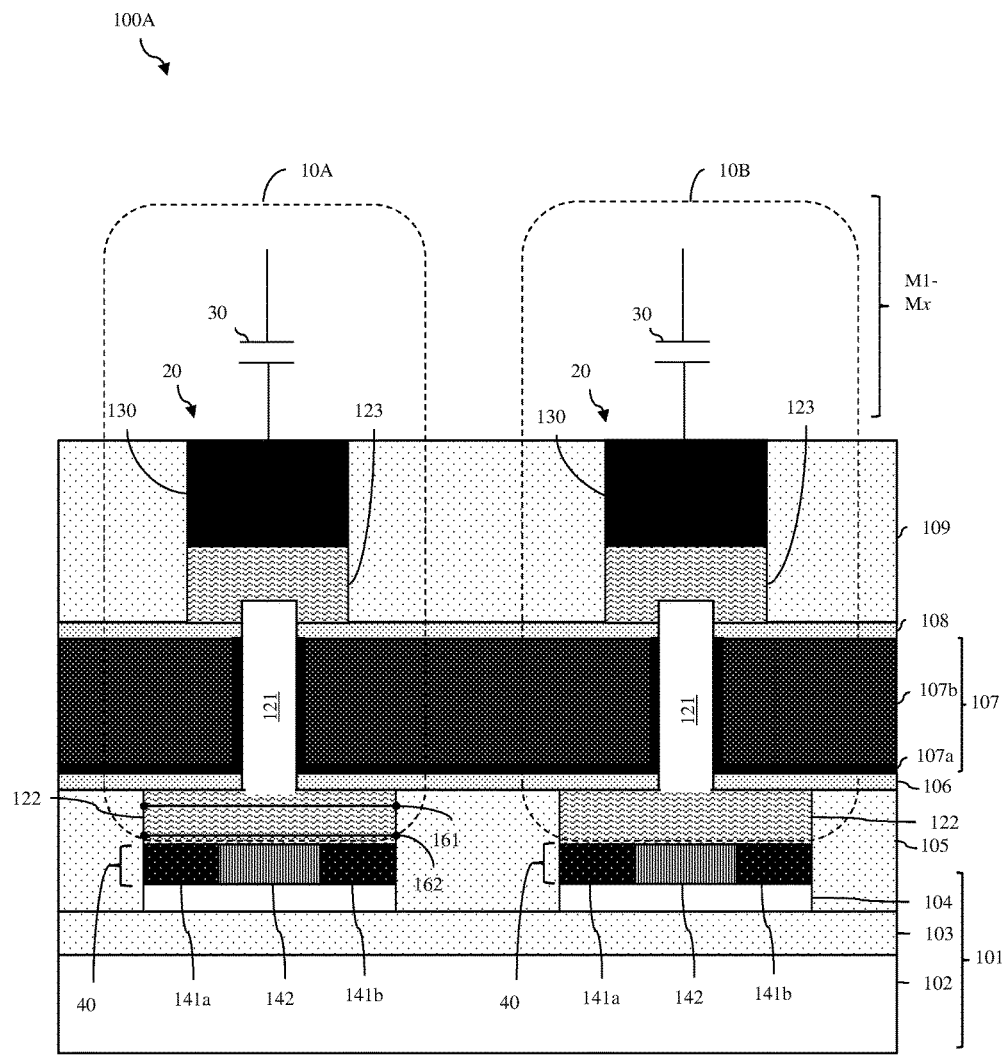
FIGS. 2A and 2B are different cross-section diagrams illustrating portions of an embodiment 100A of a disclosed memory array.
Figure 2B:
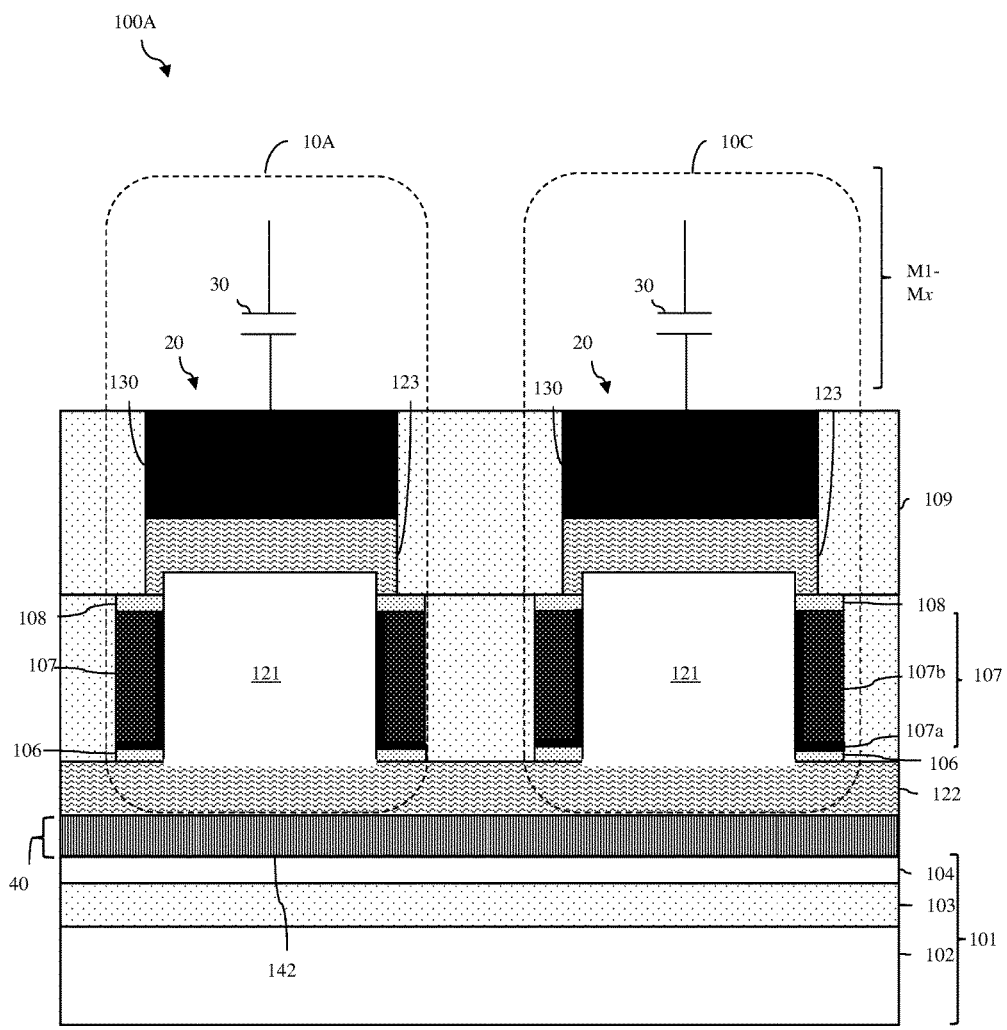
Figure 3:
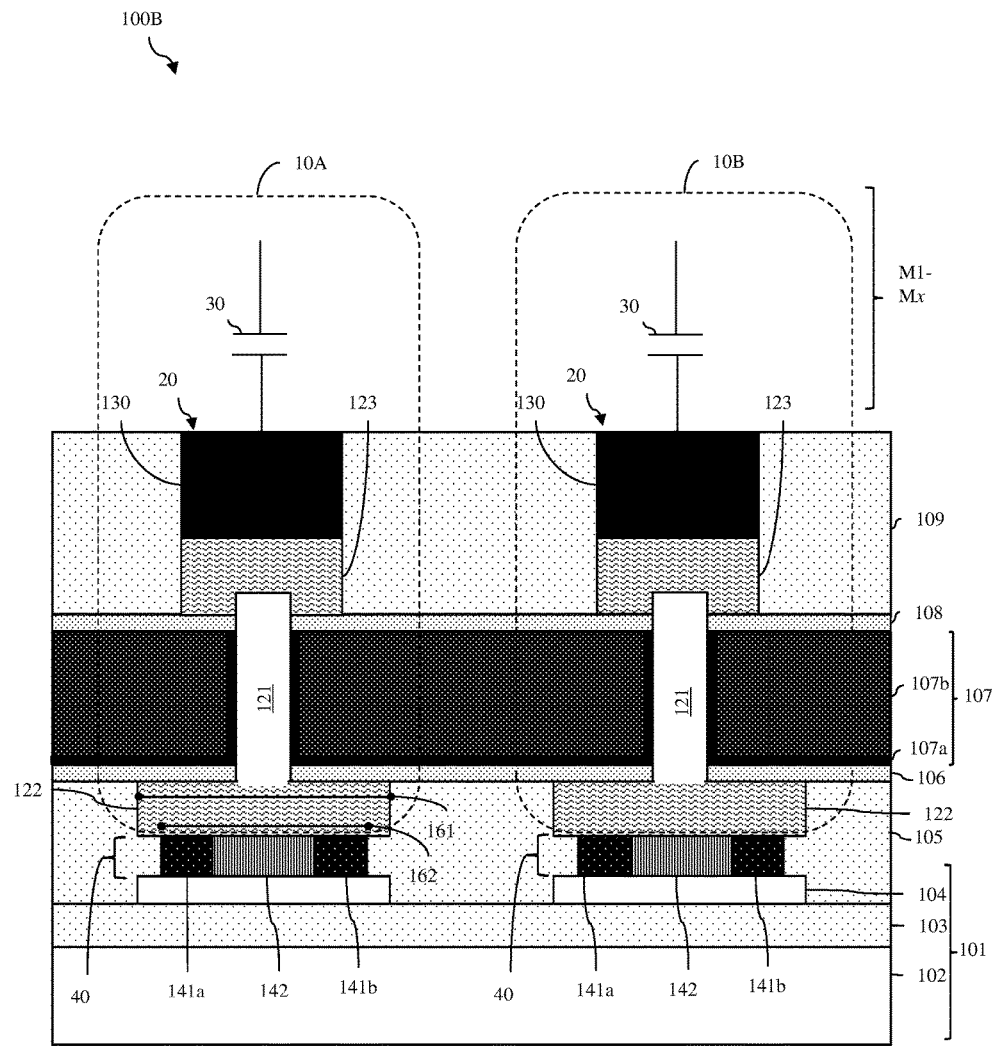
FIGS. 3-5 are cross-section diagrams illustrating portions of different embodiments 100B-100D, respectively, of the disclosed memory array.
Figure 4:
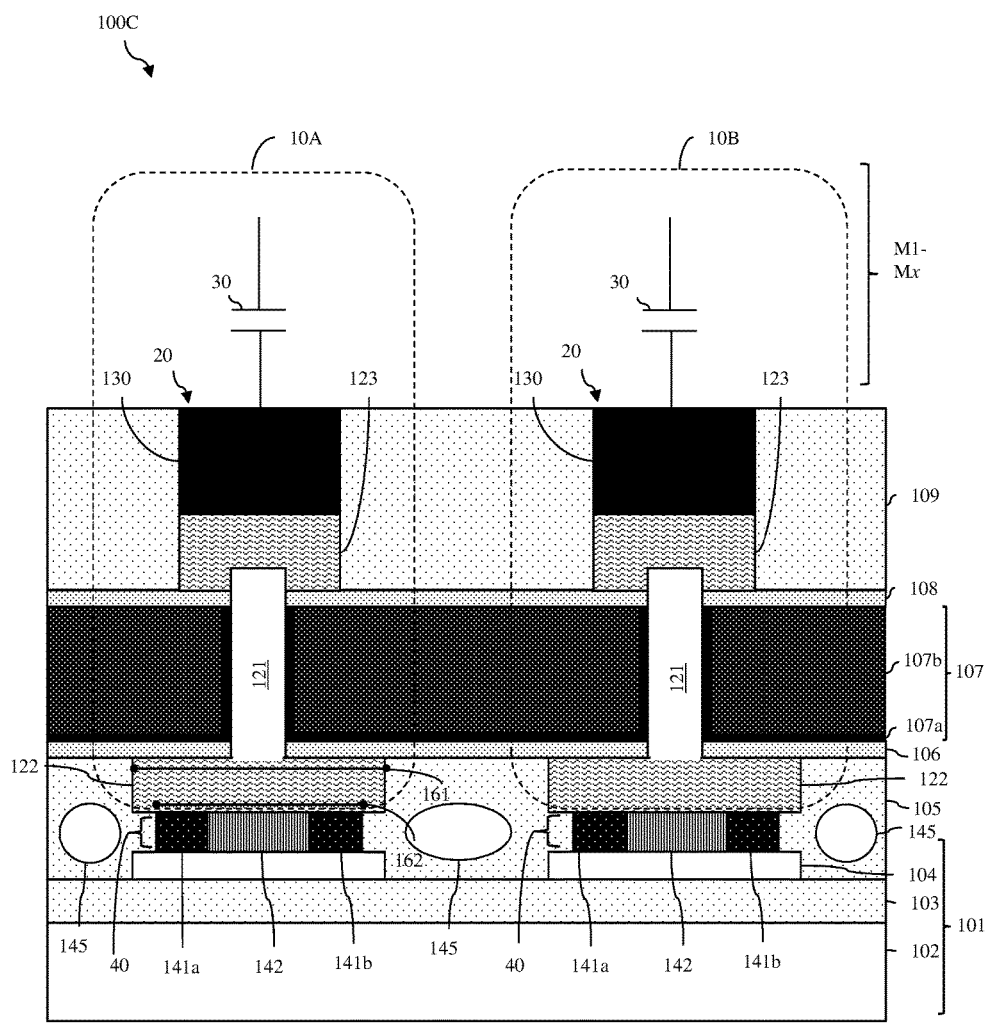
Figure 5:
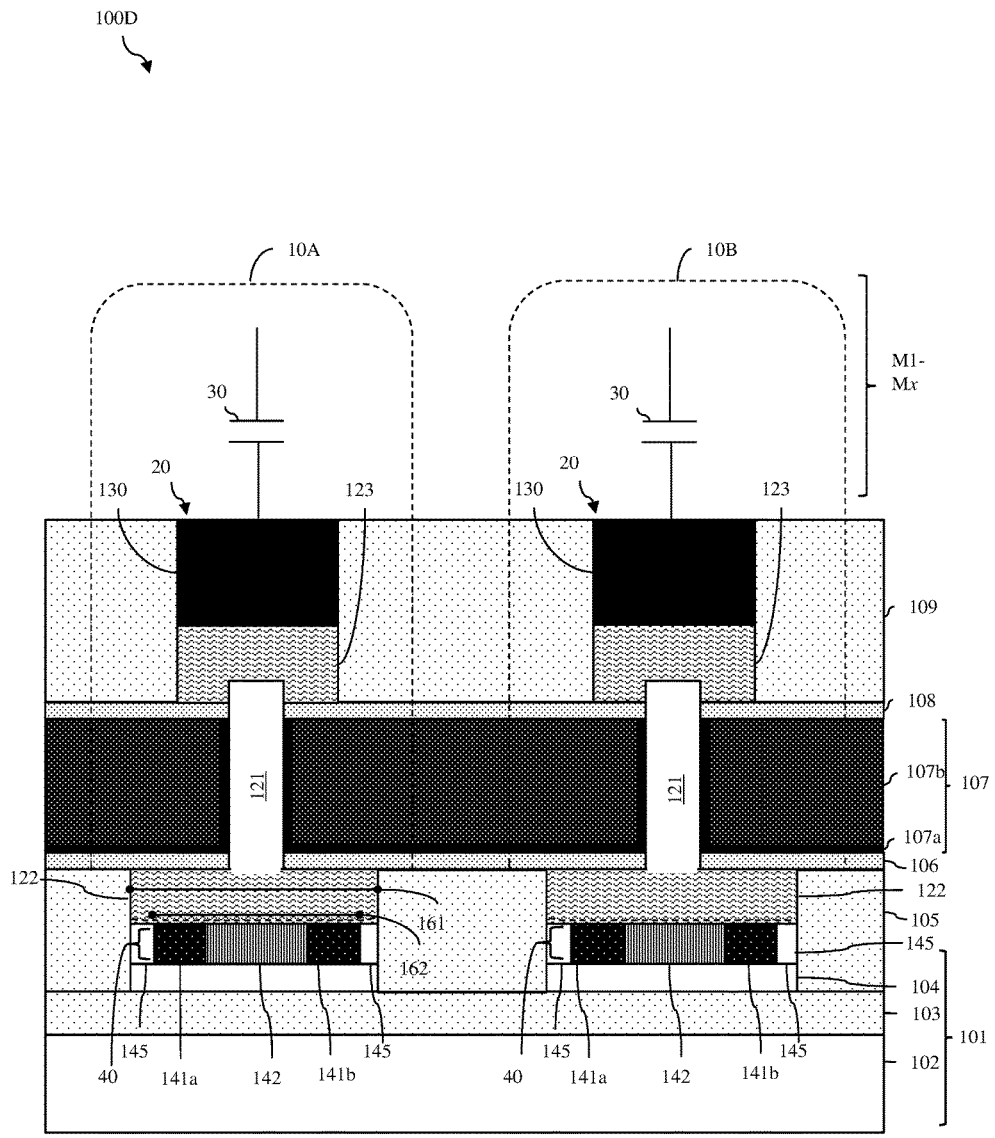

FIGS. 2A and 2B are different cross-section diagrams illustrating, in greater detail, portions of an embodiment 100A of the disclosed memory array. Specifically, FIG. 2A is a cross-section diagram illustrating a pair of adjacent DRAM cells (e.g., DRAM cells 10A and 10B from FIG. 1), which are in a row of DRAM cells within the memory array and which are aligned above and connected to different buried BLs 40. FIG. 2B is a cross-section diagram illustrating another pair of adjacent DRAM cells (e.g., DRAM cells 10A and 10C from FIG. 1), which are in a column of DRAM cells within the DRAM array and which are aligned above and connected to the same buried BL. FIGS. 3-5 are cross-section diagrams illustrating portions of different embodiments 100B-100D, respectively, of the disclosed memory array and, particularly, illustrating the same pair of adjacent DRAM cells (e.g., DRAM cells 10A and 10B) with various optional features that can be incorporated therein, as discussed in detail below.

Referring to FIGS. 2A-5, each of the embodiments 100A-100D of the memory array can include a substrate 101 having a monocrystalline semiconductor surface. The substrate 101 can be, for example, a semiconductor-on-insulator substrate, as illustrated. That is, the substrate 101 can include a semiconductor substrate 102, an insulator layer 103 on the semiconductor substrate 102 and a monocrystalline semiconductor layer 104 on the insulator layer 103. The semiconductor substrate 102 can be made of a first semiconductor material (e.g., silicon) or any other suitable semiconductor material. The insulator layer 103 can be made of a silicon dioxide or any other suitable insulator material. The semiconductor layer 104 can be made of the first semiconductor material (e.g., silicon) or any other suitable semiconductor material. Alternatively, the substrate 101 can be a bulk semiconductor substrate made of the first semiconductor material (e.g., silicon) or any other suitable semiconductor material.

Each of the embodiments 100A-100D of the memory array can further include multiple, essentially parallel, buried BLs 40 on the substrate 101 and oriented in a first direction. Each of the buried BLs 40 can have a first surface (i.e., a bottom surface) immediately adjacent to the substrate 101 (e.g., aligned above segments of the semiconductor layer 104) and a second surface (i.e., a top surface) opposite the first surface. Each buried BL 40 can include a pair of essentially parallel, elongated, BL sections 141a and 141b that extend the length of the buried BL 40 and a semiconductor region 142 positioned laterally between the BL sections 141a and 141b. The BL sections 141a and 141b can be made of a conductor including one or more layers metal and/or metal alloy materials (e.g., tungsten, titanium, titanium nitride, tantalum, tantalum nitride, cobalt, nickel, or any other suitable conductor material). The semiconductor region 142 can be made of a second semiconductor material (e.g., silicon germanium), which is different from the first semiconductor material (e.g., silicon).

Each of the embodiments 100A-100D of the memory array can further include multiple memory cells (e.g., DRAM cells as shown in FIG. 1) arranged in columns, which are oriented in the first direction (i.e., the same direction as the BLs 40) and rows, which are oriented in a second direction that is perpendicular to the first direction. Each memory cell will include a VFET 20 aligned above and connected to a buried BL 40. Within any given row of the memory cells, the VFETs 20 of the memory cells in that row will be aligned above different ones of the buried BLs 40, respectively. For example, see FIGS. 2A and 3-5 that show the VFETs 20 of adjacent DRAM cells 10A and 10B, which are in a row of DRAM cells within the memory array, as being aligned above and connected to different buried BLs 40. Furthermore, within any given column of the memory cells, the VFETs 20 of the memory cells in that column will be aligned above and connected to the same buried BL 40 (i.e., the memory cells in the given column will have a shared BL). For example, see FIG. 2A that shows the VFETs 20 of adjacent DRAM cells 10A and 10C, which are in a column of DRAM cells within the memory array, as being aligned above and connected to the same buried BL 40.

Each VFET 20 within each memory cell of the memory array can include a first source/drain (S/D) region 122 (i.e., a lower S/D region), which is essentially center-aligned above a buried BL 40 and which is immediately adjacent to the second surface (i.e., the top surface) of that buried BL 40 such that the buried BL 40 is stacked between the substrate and the first S/D region 122. Within any given row of the memory cells in the memory array, the first S/D regions 122 of the VFETs 20 of the memory cells will be discrete S/D regions aligned aligned above and immediately adjacent to discrete buried BLs 40, respectively (e.g., see FIGS. 2A and 3-5 and the discrete first S/D regions 122 of the VFETs 20 of the adjacent DRAM cells 10A and 10B within the same row). However, within any given column of the memory cells in the memory array, a single first S/D region 122 can be shared amongst the VFETs 20 of the memory cells in that column and this shared, single, first S/D region 122 can be aligned above and immediately adjacent to the same BL 40 (e.g., see FIG. 2B and the shared first S/D region 122 of the VFETs 20 of the adjacent DRAM cells 10A and 10C that are within the same column). That is, the memory cells in that given column will have a shared BL. In any case, each first S/D region 122 can be made of the first semiconductor material (e.g., silicon) and can be doped so as to have a first-type conductivity at a relatively high conductivity level (e.g., P+ conductivity for a P-type VFET or N+ conductivity for an N-type VFET). It should be noted that each first S/D region 122 can have a first width 161 and the buried BL 40 below can have a second width 162. As illustrated in the embodiment 100A of FIG. 2A, the first width 161 of first S/D region 122 can be approximately equal to the second width 162 of the buried BL 40. Alternatively, as illustrated in the embodiments 100B-100D of FIGS. 3-5, the second width 162 can be less than the first width 161.

Interlayer dielectric (ILD) material 105 can be positioned laterally adjacent to opposing sides of each BL 40 and further adjacent to opposing sides of each first S/D region 122 above. The ILD material 105 can be silicon dioxide. Alternatively, the ILD material 105 can be silane oxide or any other suitable ILD material, such as borophosphosilicate glass (BPSG), tetraethyl orthosilicate (TEOS), fluorinated tetraethyl orthosilicate (FTEOS), etc. Optionally, airgaps 145 (also referred to as voids or air pockets) can be located within the ILD material 105 so as to be positioned laterally between adjacent BLs 40 (see the embodiment 100C of FIG. 4). It should be understood that such airgaps can be present within the ILD material 105 regardless of whether the first width 161 of the first S/D region 122 is greater than the second width 162 of the buried BL 40 below or not. Alternatively, when the first width 161 of the first S/D region 122 is greater than the second width 162 of the buried BL 40 below, the airgaps 145 can be located between the sidewalls of the BLs 40 and the ILD material 105 (see the embodiment 100D of FIG. 5).

Each VFET 20 within each memory cell can also include at least one channel region 121 on the first S/D region 122 opposite the buried BL 40 (i.e., the first S/D region 122 can be stacked between the buried BL 40 and the channel region 121). For purposes of illustration, each VFET 20 is shown in FIGS. 2A-5 as having only a single channel region 121. However, those skilled in the art will recognize that additional channel regions could be incorporated into the VFETs 20 in order to provide more drive current. Each channel region 121 can be made of the first semiconductor material (e.g., silicon). Each channel region 121 can be doped so as to have a second-type conductivity at a relatively low conductivity level (e.g., N-conductivity for a P-type VFET or P− conductivity for an N-type VFET). Alternatively, each channel region 121 can be undoped.

Each channel region 121 can be in the form of an elongated semiconductor body that extends vertically above the first S/D region 122. The elongated semiconductor body can be, for example, a semiconductor fin. A semiconductor fin refers to an essentially, rectangular-shaped, semiconductor body that is relatively tall, long, and narrow. For example, a semiconductor fin can have a height dimension that is greater than 100 nm, a length dimension that is also greater than 100 nm and a width dimension that is constrained to tens of nanometers or less (i.e., constrained to 100 nm or less). The semiconductor fin can be oriented in the first direction (i.e. in the same direction as the BLs) such that the length of the semiconductor fin runs essentially parallel to BL below, as illustrated in FIGS. 2A and 2B. Alternatively, the semiconductor fin can be oriented in the second direction such that the length of the semiconductor fins runs essentially perpendicular to the BL below (not shown). Alternatively, the elongated semiconductor body can be, for example, a semiconductor nanowire (NW). A semiconductor NW refers to a semiconductor body that is relatively tall, short and narrow. For example, a semiconductor NW can have a height dimension that is greater than 100 nm, a length dimension that is constrained to tens of nanometers or less (i.e., constrained to 100 nm or less) and a width dimension that is also constrained to tens of nanometers or less (i.e., constrained to 100 nm or less). In a semiconductor NW, the ratio of the length dimension to the width dimension can, for example, be approximately 1 to 1 and the NW can have a horizontal cross-section that is square-shaped or circle-shaped.

Each VFET 20 within each memory cell can further include: a second S/D region 123 (i.e., an upper S/D region) above the channel region 121; a gate 107 (e.g., a gate-all-around structure) between the first S/D region 122 and the second S/D region 123 and laterally surrounding the channel region 121; and a first spacer layer 106 (i.e., a lower spacer layer) and a second spacer layer 108 (i.e., an upper spacer layer) that electrically isolate the gate 107 from the first S/D region 122 and the second S/D region 123, respectively.

Specifically, the first spacer layer 106 can be above and immediately adjacent to the first S/D region 122, can laterally surround a lower end of the semiconductor body and can further extend onto the ILD material 105. The first spacer layer 106 can be made of a dielectric spacer material. The dielectric spacer material can be, for example, a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the first spacer layer 106 is hydrogenated silicon oxycarbide (SiOCH). Alternatively, any other suitable dielectric spacer material could be used.

The gate-all-around structure 107 can include a conformal gate dielectric layer 107a on the top surface of the first spacer layer 106 and further immediately adjacent to vertical surfaces of the semiconductor body at the channel region 121. The gate dielectric layer 107a can be made, for example, of silicon dioxide or a high-K gate dielectric material. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The gate-all-around structure 107 can further include at least one gate conductor layer 107b on the gate dielectric layer 107a. The gate conductor layer 107b can be made, for example, of doped polysilicon. Alternatively, the gate conductor layer 107b can be made of a work function metal and, optionally, a fill metal on the work function metal. It should be noted that the metal or metal alloy material of such a work function metal can be preselected in order to achieve the optimal gate conductor work function given the conductivity type of the VFET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten, aluminum and cobalt.

The second spacer layer 108 can be above and immediately adjacent to the top surface of the gate conductor layer 107b and can laterally surround an upper end of the semiconductor body. The second spacer layer 108 can be made of the same dielectric spacer material as the first spacer layer 106. Alternatively, the second spacer layer 108 could be made of a different dielectric spacer material.

A blanket layer of additional ILD material 109 can be on the second spacer layer 108. The additional ILD material 109 can be the same ILD material as the ILD material 109. Alternatively, the additional ILD material 109 can be a different ILD material. In any case, additional ILD material 109 should be a different material than that used for the second spacer layer 108.

A S/D opening can extend essentially vertically through the blanket layer of additional ILD material 109 and can be aligned above the semiconductor body such that the top surfaces of the semiconductor body and the adjacent second spacer layer 108 are exposed at the bottom of the S/D opening. The second S/D region 123 (i.e., upper S/D region) can fill a lower portion of the S/D opening and a S/D contact 130 can fill the upper portion of the S/D opening. The second S/D region 123 can be made of an epitaxial semiconductor material. The epitaxial semiconductor material can be the same semiconductor material as the first semiconductor material (e.g., silicon) or, alternatively, can be a different semiconductor material. In any case, each second S/D region 123 can be in-situ doped so as to have the first-type conductivity at a relatively high conductivity level (e.g., P+ conductivity for a P-type VFET or N+ conductivity for an N-type VFET). The S/D contact 130 can be above and immediately adjacent to the second S/D region 123. The S/D contact 130 can include optional metal silicide, adhesive and/or barrier layers as well as a conductive fill material and, particularly, a metal or metal alloy fill material (e.g., tungsten, cobalt, aluminum, or any other suitable metal or metal alloy fill material).

As mentioned above, in any given row of the memory cells in the memory array, the first S/D regions 122 of the VFETs 20 of the memory cells will be discrete S/D regions aligned above and immediately adjacent to different buried BLs 40, respectively; whereas, in any given column of the memory cells in the memory array, a single first S/D region 122 can be shared amongst the VFETs 20 of the memory cells in that column and this shared, single, first S/D region 122 can be aligned above and immediately adjacent to the same BL 40 (i.e., the memory cells in the given column will have a shared BL). It should, however, be noted that each VFET 20 in each memory cell within the memory array (regardless of positioning within a column or row) will have a discrete second S/D region 123.

Additionally, each VFET 20 in each memory cell in the memory array could have a discrete gate-all-around structure adjacent to its channel region 121 (not shown). In this case, within any given row of memory cells in the memory array, each gate-all-around structure of each VFET 20 in each memory cell in the row can be electrically connected (e.g., via a corresponding contact) to the same WL 50. Furthermore, within any given column of memory cells in the memory array, each gate-all-around structure of each VFET 20 in each memory cell in the column can be electrically connected (e.g., via a corresponding contact) to a different WL 50.

Alternatively, within any given row of memory cells in the memory array, a single gate-all-around structure 107 can be shared amongst the VFETs 20 of the memory cells in that row and, more specifically, this single, shared gate-all-around structure 107 can be adjacent to the channel regions 121 of all the VFETs 20 of all the memory cells within the row (e.g., see FIGS. 2A and 3-5 and the single, shared gate-all-around structure 107 of the VFETs 20 of adjacent DRAM cells 10A and 10B, which are in a row of DRAM cells within the memory array). This single, shared gate-all-around structure 107 can be electrically connected to a WL 50 by a single contact. Discrete gate-all-around structures will, however, be used from row to row such that, within any given column of memory cells in the memory array, each VFET 20 of each memory cell in that column will have a different gate that is electrically connected by a different contact to a different WL.

As mentioned above, the disclosed memory array can, for example, be a DRAM memory array. In this case, each memory cell and, particularly, each DRAM cell can each include a capacitor 30 electrically connected to the second S/D region 123 of the VFET 20 of that DRAM cell through the S/D contact 130. The capacitors 30 of the DRAM cells in a DRAM array can, for example, be back end of the line (BEOL) capacitors. That is, the capacitors 30 can be within one or more of the BEOL metal levels (M1-Mx) above VFETs 20. For example, each capacitor 30 can be a metal-insulator-metal (MIM), wherein the insulator is positioned laterally between the metals within the same metal level or wherein the insulator is stacked between metals in different metal levels. Such BEOL capacitors are well known in the art and, thus, the details of the capacitors have been omitted from the specification in order to allow the reader to focus on the salient aspects of the disclosed embodiments. Alternatively, the disclosed memory array could be any type of memory array where each memory cell includes a VFET 20, as described above connected to a buried BL 40, and any other components.

In any case, in each of the above-described embodiments 100A-100D of the disclosed memory array, since the BLs 40 are located below the first S/D regions 122 of the VFETs 20 of the memory cells as opposed to being located beside those first S/D regions 122, capacitive coupling between adjacent buried BLs 40 (e.g., between the adjacent buried BLs 40 aligned below the VFETs 20 of the adjacent memory cells 10A and 10B in a row of memory cells within the array, as shown in FIGS. 2A and 3-5) is reduced. Capacitive coupling between adjacent buried BLs 40 is even further reduced in the embodiments 100B-100D where the BLs 40 are narrower in width than the first S/D regions 122 and/or where airgaps 145 are present between the adjacent buried BLs.

Figure 6:
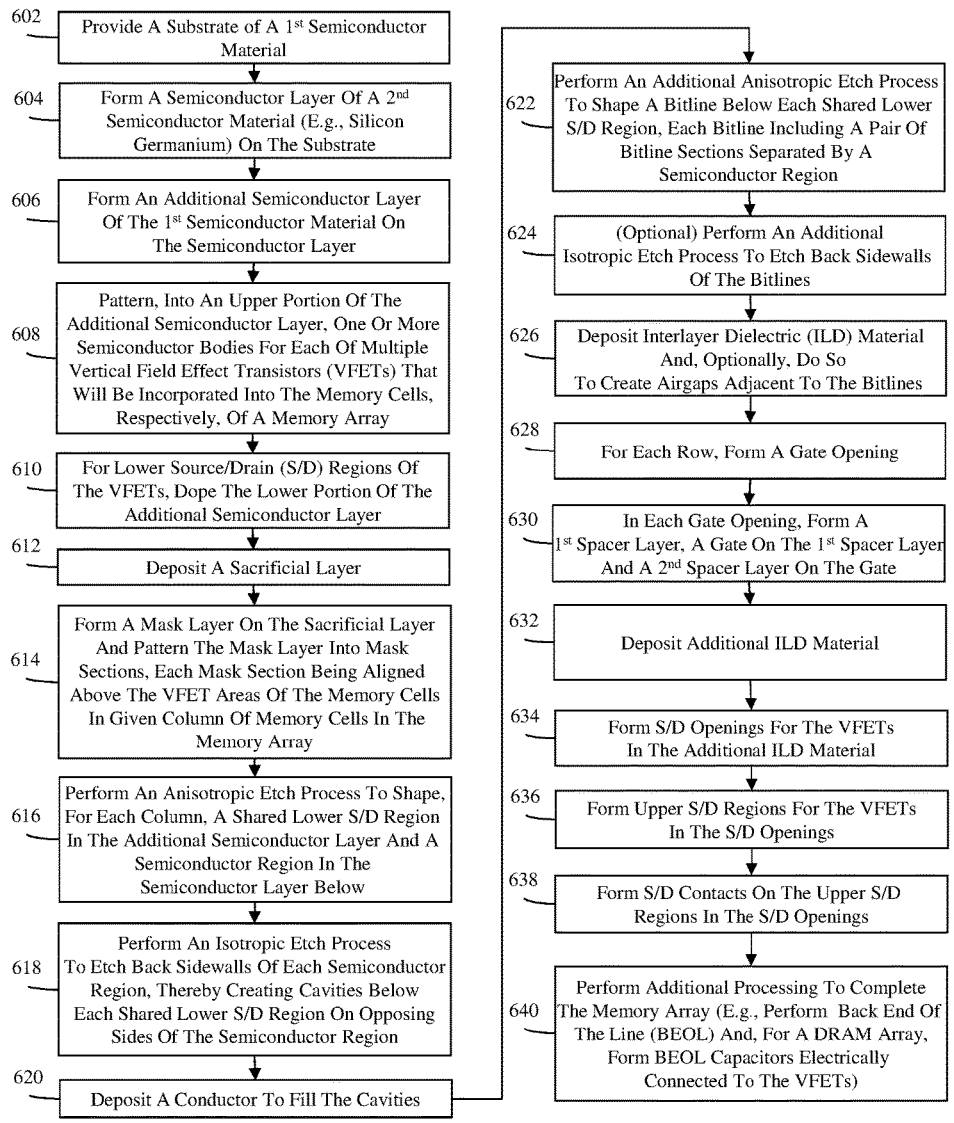
FIG. 6 is a flow diagram illustrating a method of forming the disclosed memory array.

Referring to the flow diagram of FIG. 6, also disclosed herein are embodiments of a method of forming the above-described embodiments 100A-100D of the disclosed memory array.

Figure 7:
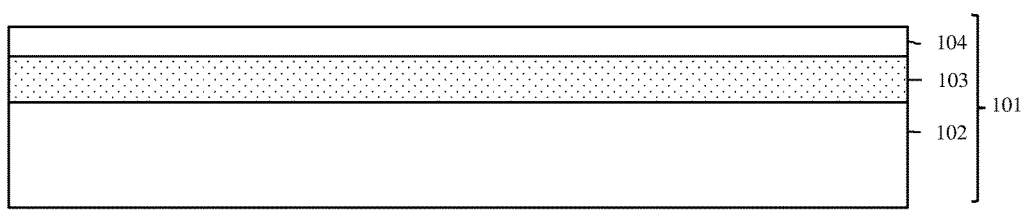
FIG. 7 is a cross-section diagram illustrating a portion of a partially completed structure formed according to the flow diagram of FIG. 6.

The method includes providing a substrate 101 (see process 602 and FIG. 7). The substrate 101 can be a semiconductor-on-insulator substrate, as illustrated. That is, the substrate 101 can include a semiconductor substrate 102, an insulator layer 103 on the semiconductor substrate 102 and a monocrystalline semiconductor layer 104 on the insulator layer 103. The semiconductor substrate 102 can be made of a first semiconductor material (e.g., silicon) or any other suitable semiconductor material. The insulator layer 103 can be made of a silicon dioxide or any other suitable insulator material. The semiconductor layer 104 can also be made of the first semiconductor material (e.g., silicon) or any other suitable semiconductor material. Alternatively, the substrate 101 can be a bulk semiconductor substrate made of the first semiconductor material (e.g., silicon) or any other suitable semiconductor material.

Figure 8:
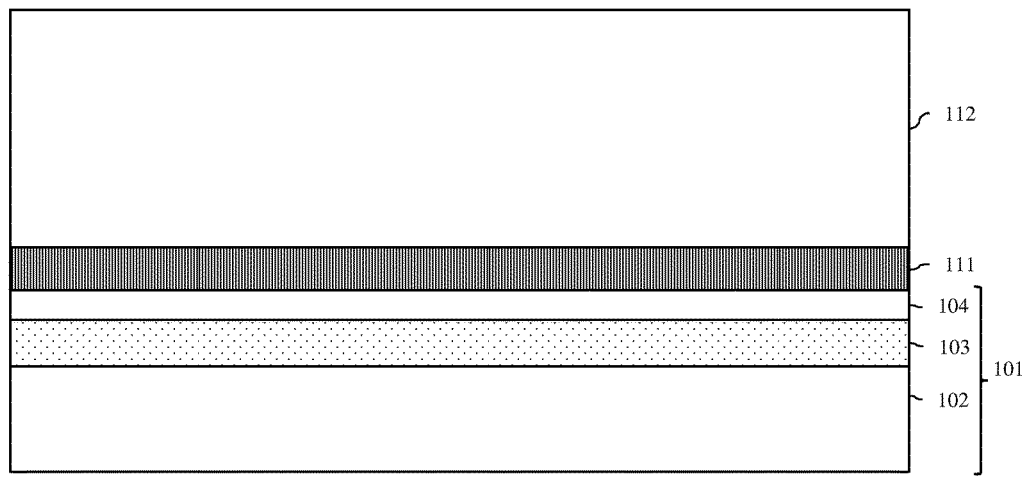
FIG. 8 is a cross-section diagram illustrating a portion of a partially completed structure formed according to the flow diagram of FIG. 6.

A stack of semiconductor layers can then be formed on the top surface of the substrate 101 (see processes 604-606 and FIG. 8). Specifically, a semiconductor layer 111 can be formed on the top surface of the substrate 101. This semiconductor layer 111 can be formed, for example, by epitaxial deposition of a second semiconductor material (e.g., silicon germanium) that is different from the first semiconductor material. An additional semiconductor layer 112 can then be formed on the top surface of the semiconductor layer 111. This additional semiconductor layer 112 can be formed, for example, by epitaxial deposition of the first semiconductor material (e.g., silicon). It should be noted that the height of the semiconductor layer 111 (as measured from the top surface of the substrate 101) can be less than the height of the additional semiconductor layer 112 (as measured from the top surface of the semiconductor layer 111.

For purposes of illustration, the remaining processes steps are described below and illustrated in the Figures with respect to formation of the adjacent memory cells 10A and 10B in a row of memory cells within the memory array, as shown in FIG. 1.

Figure 9:
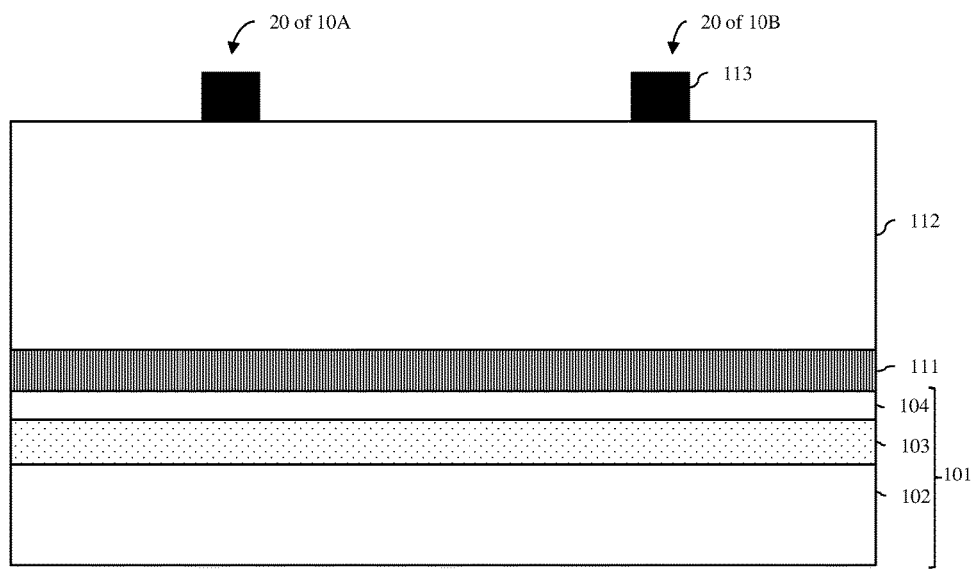
FIG. 9 is a cross-section diagram illustrating a portion of a partially completed structure formed according to the flow diagram of FIG. 6.
Figure 10:
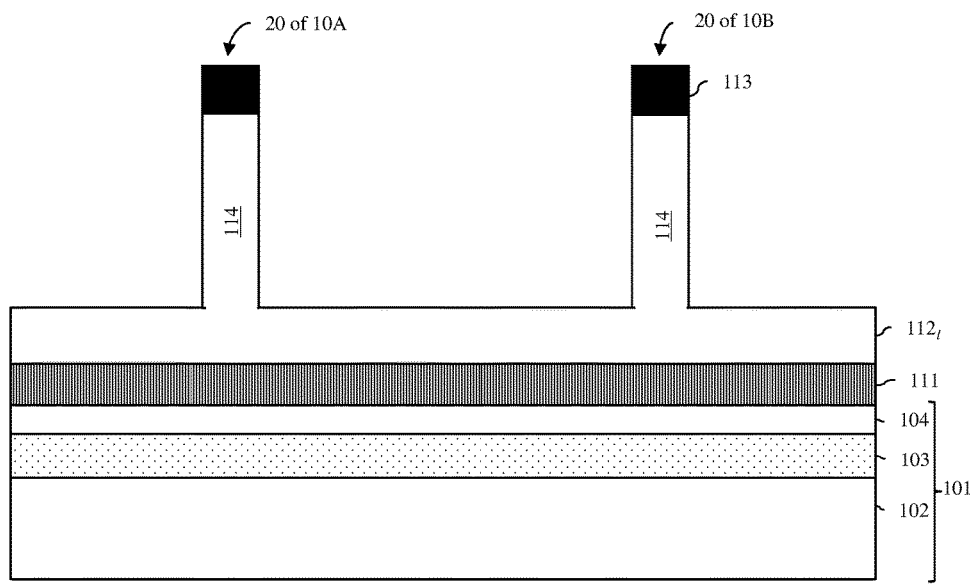
FIG. 10 is a cross-section diagram illustrating a portion of a partially completed structure formed according to the flow diagram of FIG. 6.

Next, semiconductor bodies 114 can be patterned into the upper portion of the additional semiconductor layer 112 (see process 608 and FIGS. 9-10). Specifically, one or more semiconductor bodies 114 for each of multiple vertical field effect transistors (VFETs) that will be incorporated into memory cells (e.g., dynamic random access memory (DRAM) cells), respectively, of a memory array (e.g., a DRAM array) can be patterned into an upper portion of the additional semiconductor layer 112. Patterning of the upper portion of the additional semiconductor layer 112 could be performed using, for example, conventional lithographic patterning and etch techniques (as described in greater detail below) or, alternatively, using any other suitable patterning and etch techniques (e.g., a sidewall image transfer (SIT) technique).

For example, at process 608, a hard mask layer (e.g., a silicon nitride hard mask layer) can be deposited onto the top surface of the additional semiconductor layer 112. The hard mask layer can then be lithographically patterned and etched to form mask sections 113 corresponding to the desired shapes of the semiconductor bodies (see FIG. 9). Then, an anisotropic etch process can be performed, stopping at some distance above the level of the top surface of the semiconductor layer 111, thereby forming the semiconductor bodies 114 above a remaining lower portion 1121 of the additional semiconductor layer 112 (see FIG. 10).

Figure 11A:
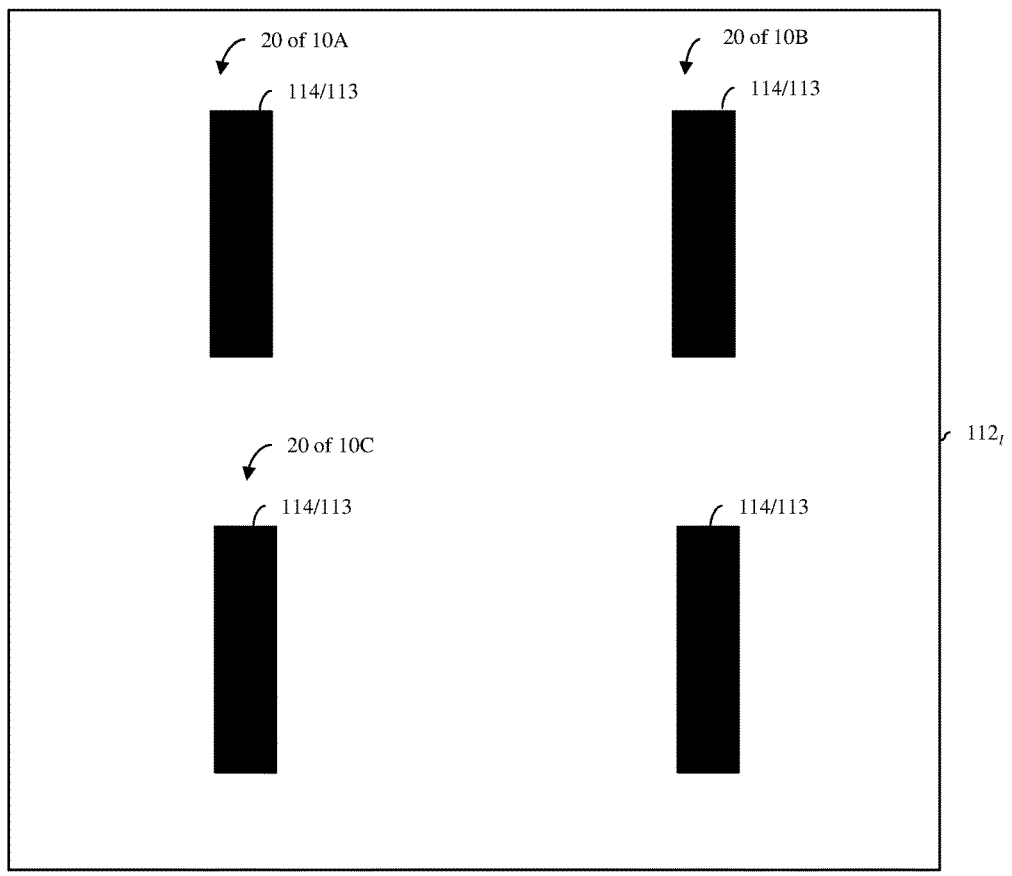
FIGS. 11A-11C are different top view diagrams illustrating portions of alternative partially completed structures with different shaped semiconductor bodies, respectively, following process 608 of the flow diagram of FIG. 6.
Figure 11B:
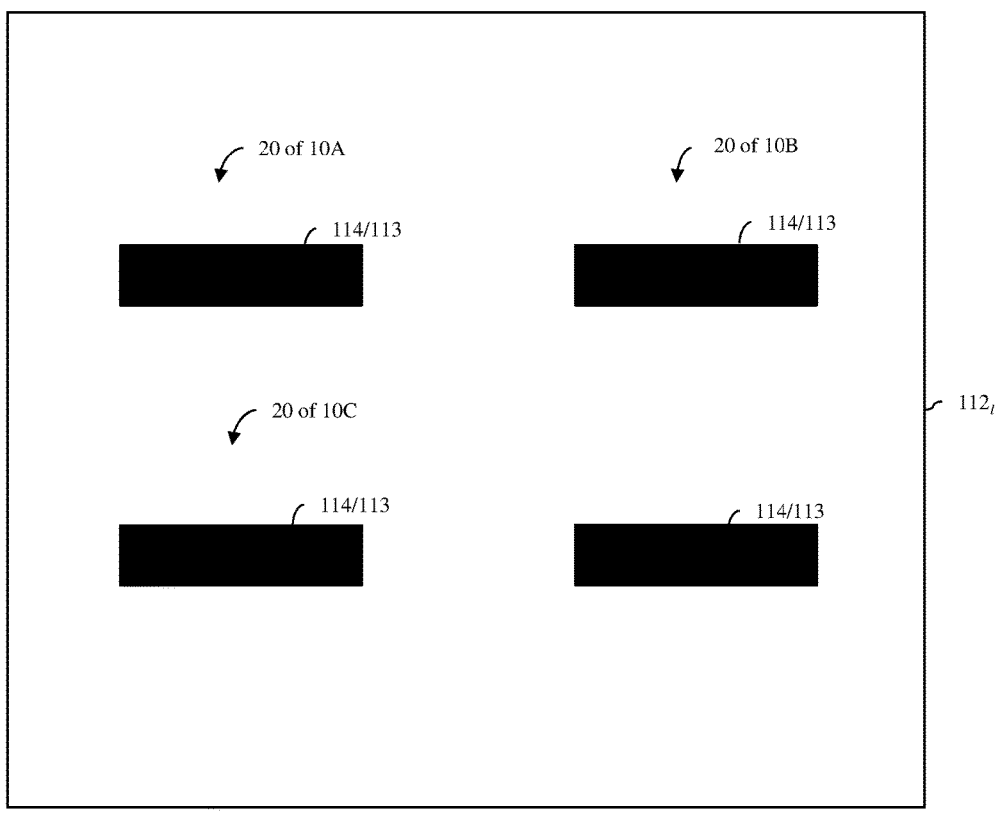
Figure 11C:
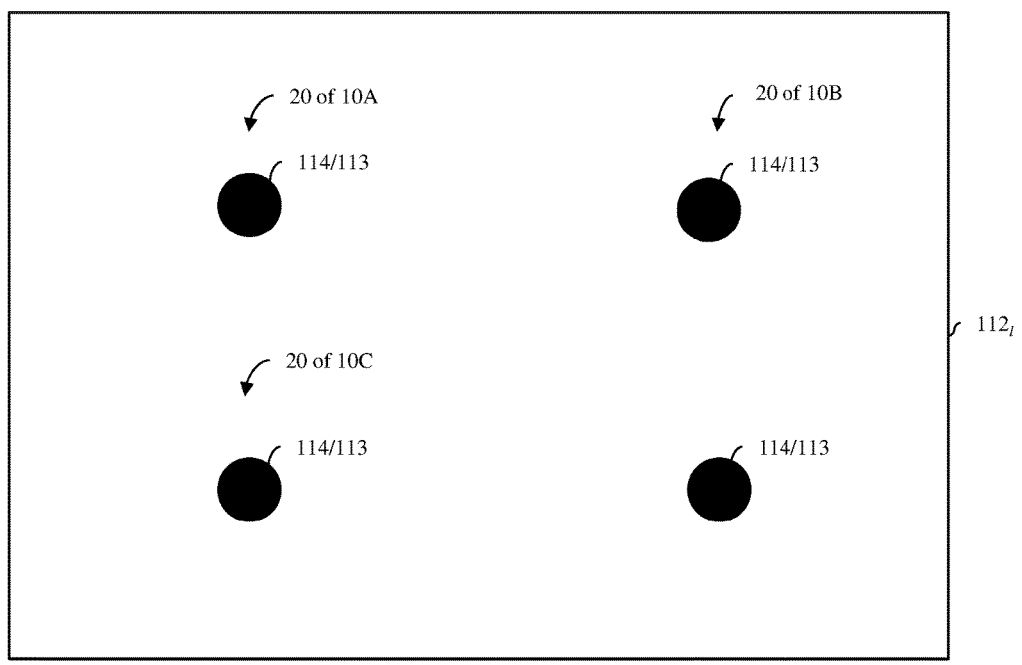

It should be noted that the semiconductor bodies 114, which are patterned into the upper portion of the additional semiconductor layer 112 at process 608, can be semiconductor fins. The semiconductor fins can be oriented in a first direction (i.e. in the same direction as the columns of memory cells will be oriented), as illustrated in the cross-section and top view diagrams of FIGS. 10 and 11A, respectively. Alternatively, the semiconductor fins could be oriented in a second direction that is perpendicular to the first direction (e.g., in the same direction as the rows of memory cells will be oriented), as illustrated in FIG. 11B. Alternatively, the semiconductor bodies 114, which are patterned into the upper portion of the additional semiconductor layer 112 at process 608, can be semiconductor nanowires (NWs), as illustrated in FIG. 11C and which would have a cross-section essentially identical to that shown in FIG. 10. Exemplary dimensions for semiconductor fins and semiconductor nanowires are set forth above in the discussion regarding the structure embodiments 100A-100D.

For purposes of illustration, the remaining processes are described below and illustrated in the Figures with respect to the partially completed structure shown in FIGS. 10 and 11A, wherein the semiconductor bodies 114 are semiconductor fins oriented in the first direction.

Figure 12:
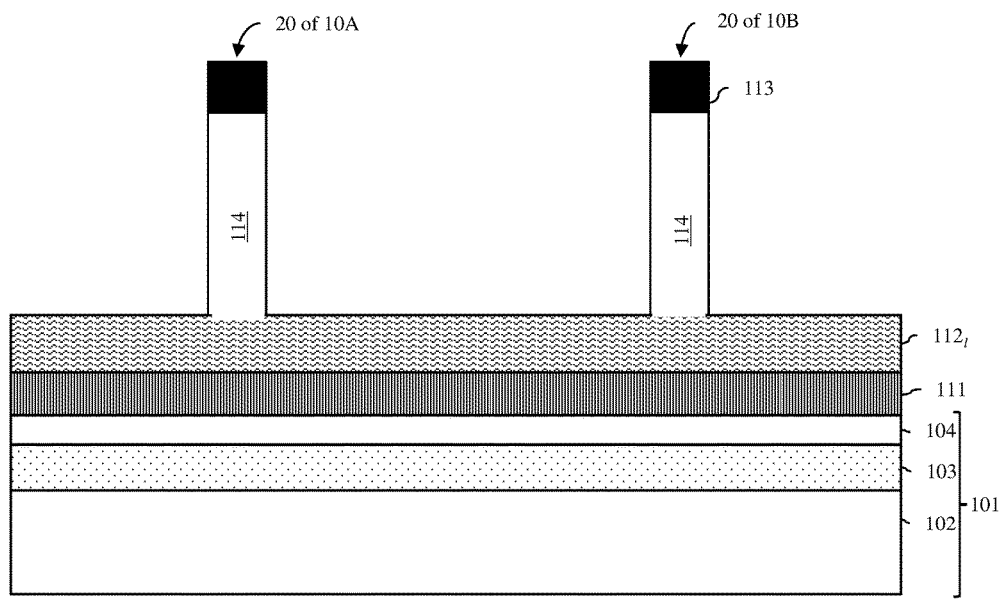
FIG. 12 is a cross-section diagram illustrating a portion of a partially completed structure formed according to the flow diagram of FIG. 6.

A dopant implantation process can subsequently be performed in order to dope the lower portion 1121 of the additional semiconductor layer, which will subsequently be patterned into first S/D regions 122 (see process 610 and FIG. 12). Specifically, the lower portion 1121 of the additional semiconductor layer can be doped with a first dopant so as to have a first-type conductivity at a relatively high conductivity level (e.g., P+ conductivity for a P-type VFET or N+ conductivity for an N-type VFET).

Figure 13A:
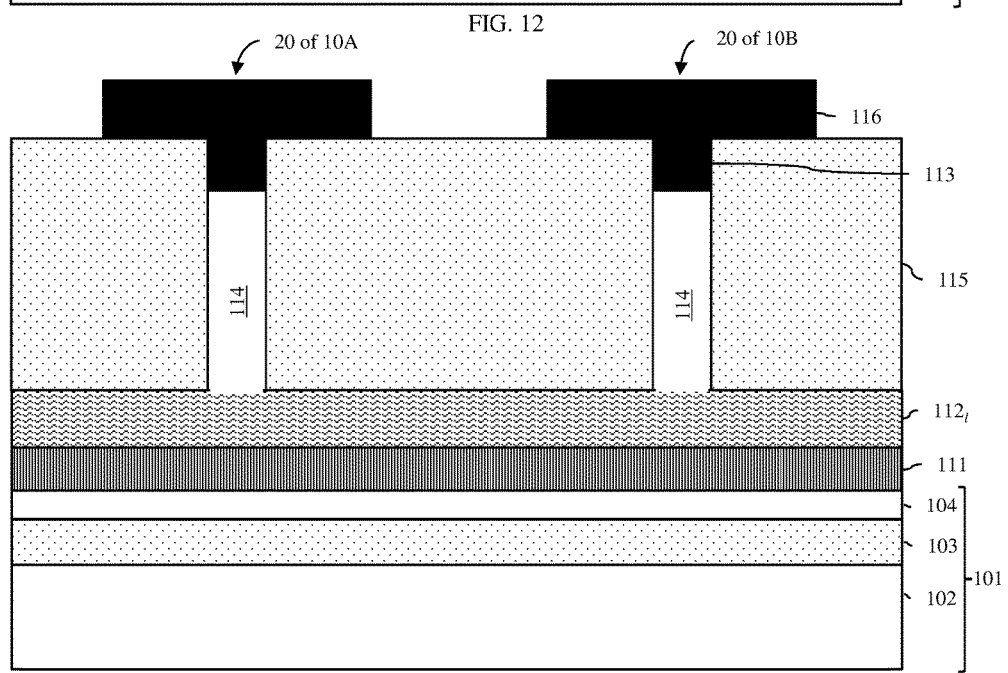
FIGS. 13A and 13B are cross-section and top view diagrams, respectively, illustrating a portion of a partially completed structure formed according to the flow diagram of FIG. 6.
Figure 13B:
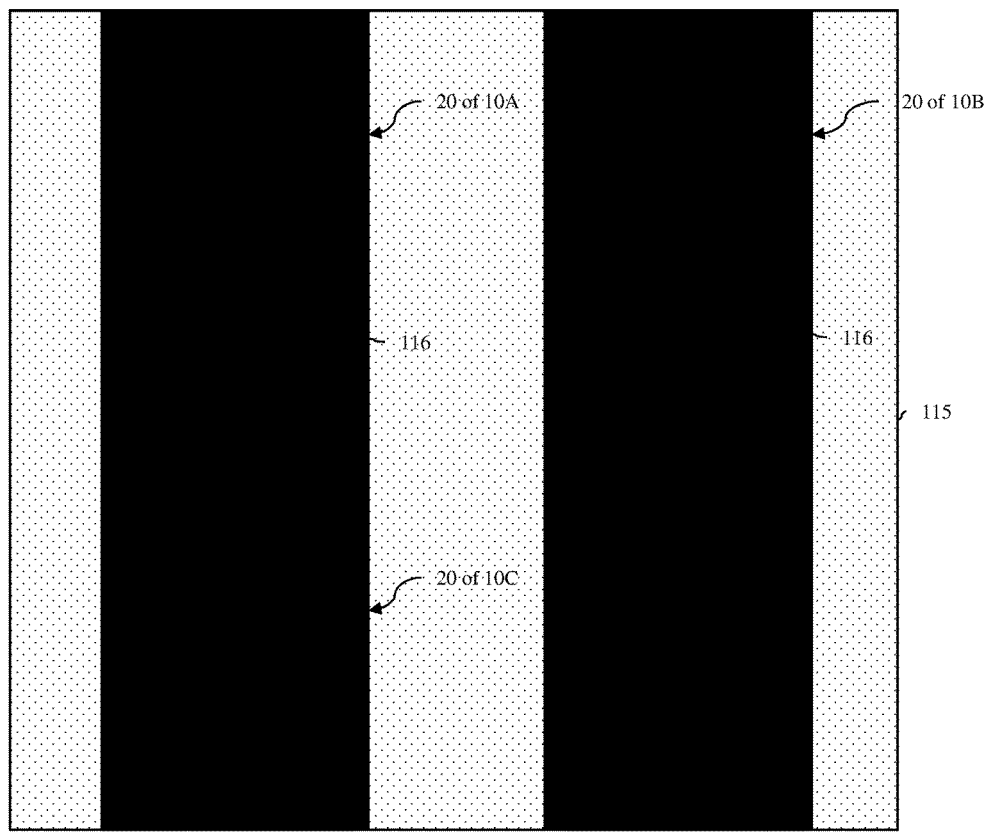

A blanket sacrificial layer 115 can be deposited to as to cover the semiconductor bodies 114 and polished (e.g., using a chemical mechanical polishing (CMP) process) to expose the mask sections 113 on the top surfaces of the semiconductor bodies (see process 612). The blanket sacrificial layer 115 can be, for example, a sacrificial dielectric layer (e.g., a sacrificial silicon dioxide layer). Then, an additional hard mask layer (e.g., an additional silicon nitride hard mask layer) can be deposited onto the blanket sacrificial layer 115. The additional hard mask layer can be lithographically patterned and etched to form mask sections 116 (see process 614 and FIGS. 13A-13B). As illustrated, each mask section 116 can be aligned above the VFET 20 areas of all the memory cells in a given column of memory cells within the memory array. Thus, for example, as illustrated in FIG. 13B, one mask section 116 can be aligned above the VFET 20 areas in all the memory cells in a column that includes the adjacent memory cells 10A and 10C as well as any additional memory cells above or below, another mask section 116 can be aligned above the VFET 20 areas in another column that includes the memory cell 10B as well as any additional memory cells above or below, etc. It should be noted that each mask section 116 can cover and be wider than the semiconductor bodies 114 within the VFET 20 areas and, specifically, can have a width that is essentially equal to the desired width of a first S/D region 122 that will subsequently be patterned into the lower portion 1121 of the additional semiconductor layer below and shared by the VFETs 20 of all memory cells within the corresponding column of memory cells.

Figure 14A:
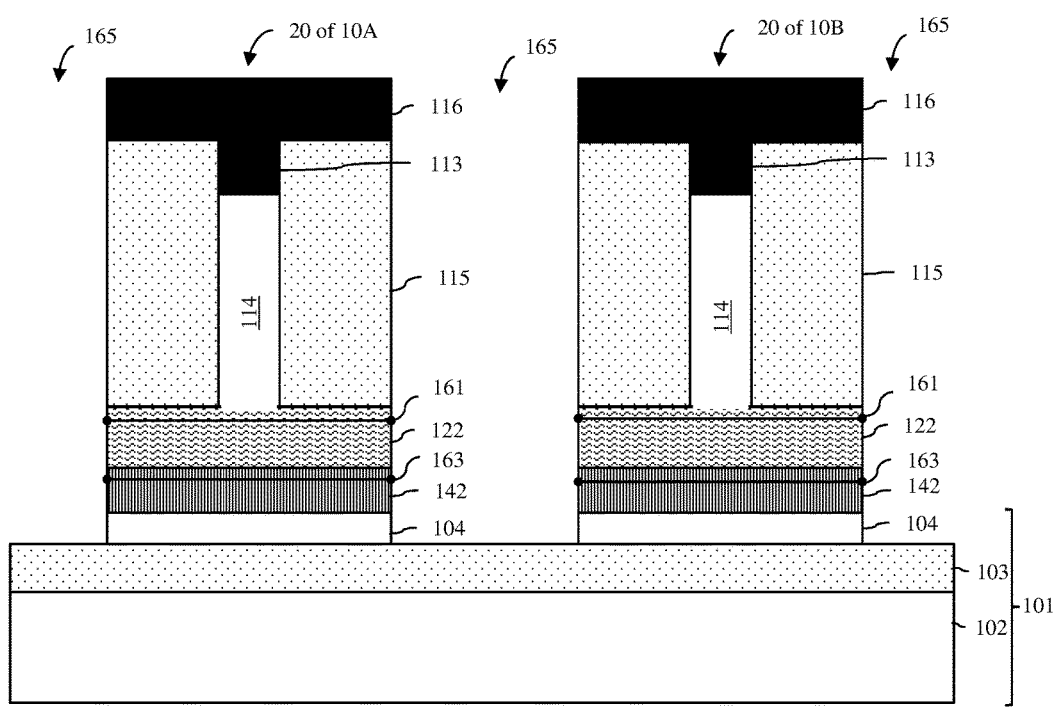
FIGS. 14A and 14B are cross-section and top view diagrams, respectively, illustrating a portion of a partially completed structure formed according to the flow diagram of FIG. 6.
Figure 14B:
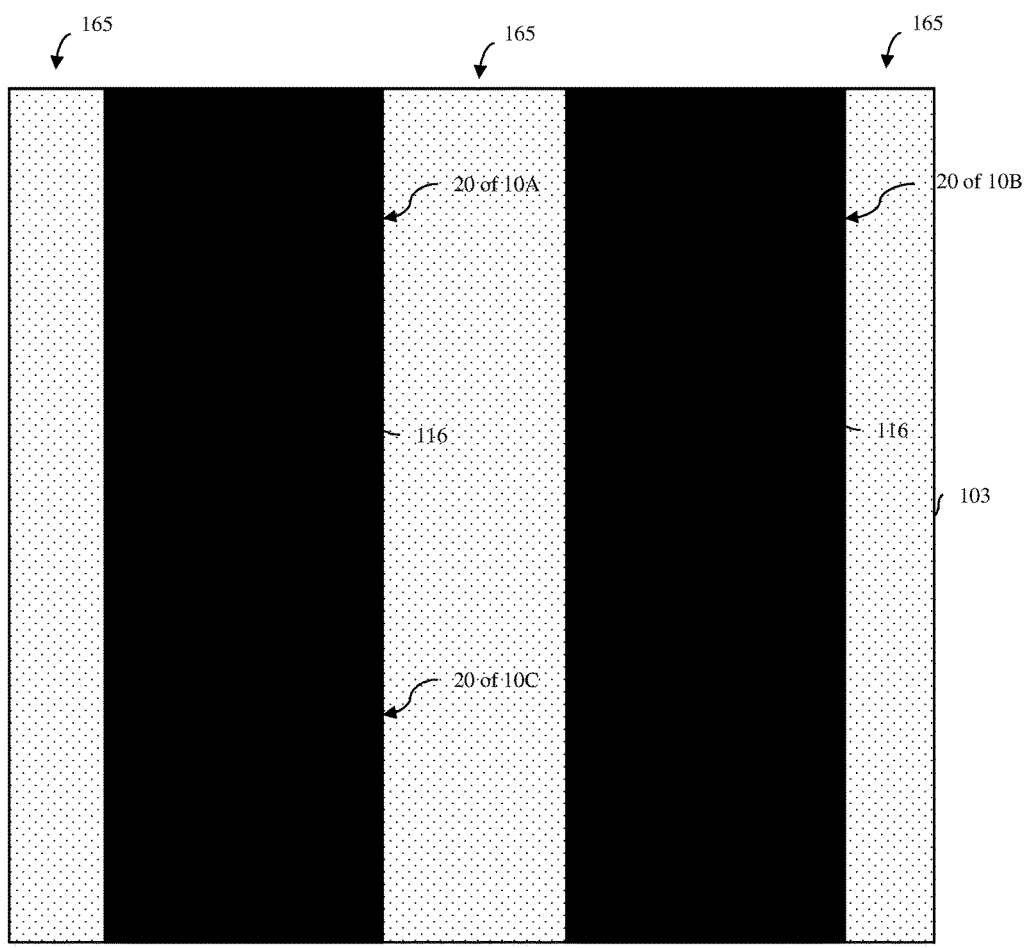

After formation of the mask sections 116, another anisotropic etch process can be performed in order to form trenches 165 that extend essentially vertically through the sacrificial layer 115, through the lower portion 1121 of the additional semiconductor layer, through the semiconductor layer 111 and into the substrate 101 (e.g., in the case of an SOI substrate, through the semiconductor layer 104 to the insulator layer 103) (see process 616 and FIGS. 14A-14B). This anisotropic etch process will shape (i.e., define the shape of, form, pattern, etc.), within the lower portion 1121 of the additional semiconductor layer below each mask section 116, a shared first S/D region 122 for the VFETs 20 in each column of memory cells with the memory array and, particularly, will shape a shared first S/D region 122 for the VFETs 20 in each column of memory cells with the memory array. Thus, the anisotropic etch process will define the width 161 of shared first S/D region 122. This anisotropic etch process will further shape (i.e., define the shape of, form, pattern, etc.) a semiconductor region 142 within the semiconductor layer 111 below each mask section 116 and, thereby below each shared first S/D region 122. Thus, following process 616, each shared first S/D region 122 and the semiconductor region 142 below will be essentially center-aligned and have essentially equal widths (i.e., the width 161 of the shared first S/D region and the width 163 of the semiconductor region 142 below will be essentially equal). It should be understood that, during the anisotropic etch process 616, the etch chemistries will be adjusted so that each of the layers (i.e., the sacrificial layer 115, the lower portion 1121 of the additional semiconductor layer, the semiconductor layer 111 and, in the case of an SOI substrate, the semiconductor layer 104) are selectively and anisotropically etched. Techniques for selective anisotropic etching of materials such as silicon dioxide, silicon and silicon germanium are well known in the art and, thus, the details of these techniques have been omitted from the specification in order to allow the reader to focus on the salient aspects of the disclosed embodiments.

Figure 15:
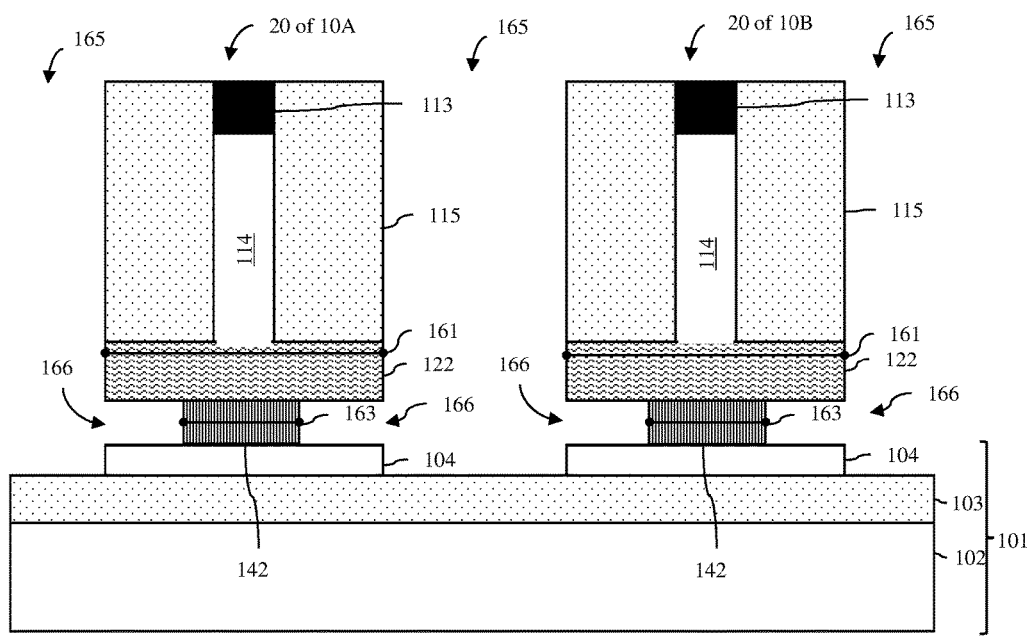
FIG. 15 is a cross-section diagram illustrating a portion of a partially completed structure formed according to the flow diagram of FIG. 6.

Subsequently, an isotropic etch process can be performed in order to selectively etch back exposed vertical surfaces (i.e., sidewalls) of each semiconductor region 142, thereby narrowing the semiconductor region 142 relative to the shared first S/D region 122 above and creating cavities 166 below each shared first S/D region 122 (see process 618 and FIG. 15). That is, following process 618, the width 163 of each semiconductor region 142 will be less than the width 161 of the shared first S/D region 122 and each semiconductor region 142 will be positioned laterally between two cavities 166. In exemplary embodiments, if the material of the semiconductor layer 111 is silicon germanium, the material of the lower portion 1121 of the additional semiconductor layer and the substrate 101 is silicon, the material of the sacrificial layer 115 is silicon dioxide, and the material of the mask sections 116 is silicon nitride, the silicon germanium semiconductor layer 111 can be selectively and isotropically etched at process 618 using any of the following exemplary processes: a thermal etch process (e.g., using gaseous hydrochloric acid (HCl)), a dry plasma etch process, or wet etch process with process specifications designed to ensure the selective etch of silicon germanium over silicon, silicon dioxide and silicon nitride. It should be noted that the timing of process 618 should be controlled in order to avoid complete removal of the semiconductor layer 111 and maintain a robust structure. The mask sections 116 can then be selectively removed.

Figure 16:
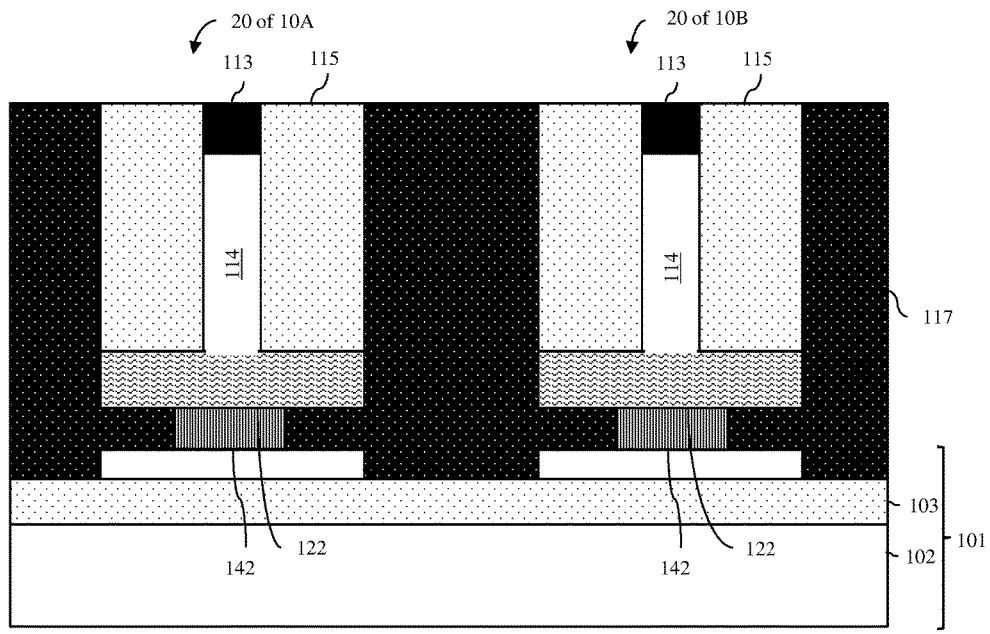
FIG. 16 is a cross-section diagram illustrating a portion of a partially completed structure formed according to the flow diagram of FIG. 6.

A conductor 117 can be deposited so as to fill the cavities 166 (see process 620 and FIG. 16). Specifically, at process 620 one or more layers metal and/or metal alloy materials (e.g., tungsten, titanium, titanium nitride, tantalum, tantalum nitride, cobalt, nickel, or any other suitable conductor material) can be deposited such that the cavities 166 are completely filled. Then, a polishing process (e.g., a CMP process) can be performed in order to remove any of the conductor material from above the top surface of the sacrificial layer 115.

Figure 17:
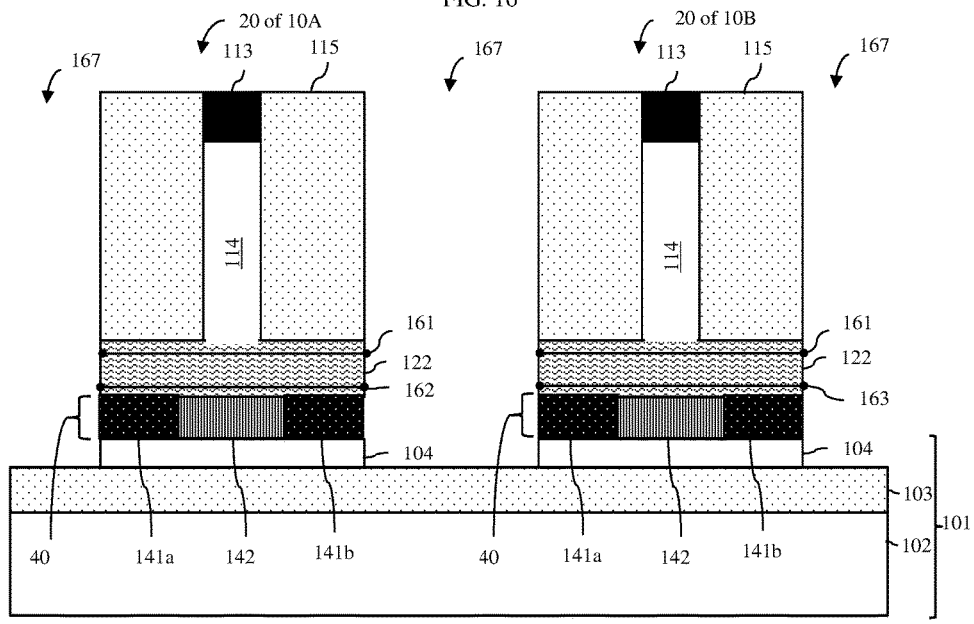
FIG. 17 is a cross-section diagram illustrating a portion of a partially completed structure formed according to the flow diagram of FIG. 6.

Following deposition of the conductor 117, an additional anisotropic etch process can be performed in order to form additional trenches 167 that extend essentially vertically through the conductor 117 to the substrate 101 (e.g., in the case of an SOI substrate, to the insulator layer 103) (see process 622 and FIG. 17). This additional anisotropic etch process can specifically be selective for the material of the conductor 117 over the materials of the sacrificial layer 115, the lower portion 1121 of the additional semiconductor layer, and the substrate 101. In an exemplary embodiment, if the conductor 117 is tungsten, a reactive ion etch (RIE) can be performed to selectively and anisotropically etch tungsten using fluorinated gas plasmas (e.g., sulfer hexafluoride (SF6), tetrafluoromethane (CF4), bromotrifluoromethane (CBrF3) or trifluoromethan (CF3)) with the etch conditions (e.g., power, pressure, etc.) optimized to achieve the desired etch selectivity over silicon, silicon dioxide and silicon nitride. Those skilled in the art will recognize that, in order to achieve the desired etch selectively, the etch chemistry and/or etch conditions used at process 622 will vary depending upon the material(s) of the conductor as well as the materials of the sacrificial layer 115, the lower portion 1121 of the additional semiconductor layer and the substrate 101 (e.g., in the case of an SOI substrate, the materials of the semiconductor layer 104 and insulator layer 103). In any case, process 622 should be performed in order to remove any portion of the conductor 117 that extends laterally beyond (i.e., outside) the cavities 166 and to thereby shape (i.e., define a shape of, form, pattern, etc.) a buried bitline (BL) 40 for the memory array below each shared first S/D region 122. Each buried BL 40 will include a pair of essentially parallel elongated bitline sections that extend the length of the bitline and, particularly, a first BL section 141a and a second BL section 141b. Each buried BL 40 will also include the semiconductor region 142, which is positioned laterally between the first BL section 141a and the second BL section 141b (i.e., which is essentially parallel to and fills a space between the BL sections). It should be noted that, following process 622, the width 161 (referred to herein as the first width in the discussion of the structure embodiments above) of each shared first S/D region 122 and the width 162 (referred to as the second width in the discussion of the structure embodiments above) of the buried BL 40 below will be essentially equal.

Figure 18:
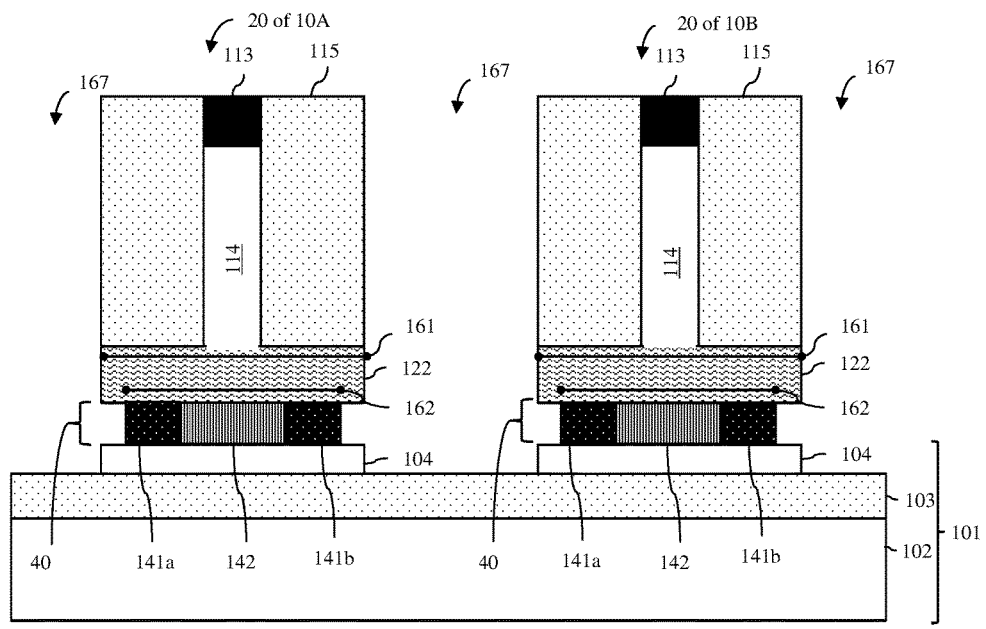
FIG. 18 is a cross-section diagram illustrating a portion of a partially completed structure formed according to optional process 624 in the flow diagram of FIG. 6.

Optionally, an additional isotropic etch process can be performed in order to selectively etch back exposed vertical surfaces (i.e., the outer sidewalls) of the BLs 40 and, particularly, of the BL sections 141a-141b such that the width 162 of each BL 40 is less than the width 161 of the shared first S/D region 122 above (see process 624 and FIG. 18). For example, at process 624, a wet etch process, which is tailored to selectively and isotropically etch the material of the conductor 117 over the materials of the sacrificial layer 115, the lower portion 1121 of the additional semiconductor layer, and the substrate 101, can be performed.

For purposes of illustration, unless otherwise noted, the remaining process steps are described below and illustrated in the Figures with respect to the partially completed structure shown in FIG. 17 (wherein the widths of the buried BL 40 and the shared first S/D region 122 above are essentially equal). However, it should be understood that these same process steps could, alternatively, be performed with respect to the partially completed structure shown in FIG. 18 (wherein the width 162 of the buried BL 40 is less than the width 161 of the shared first S/D region 122 above).

Figure 19A:
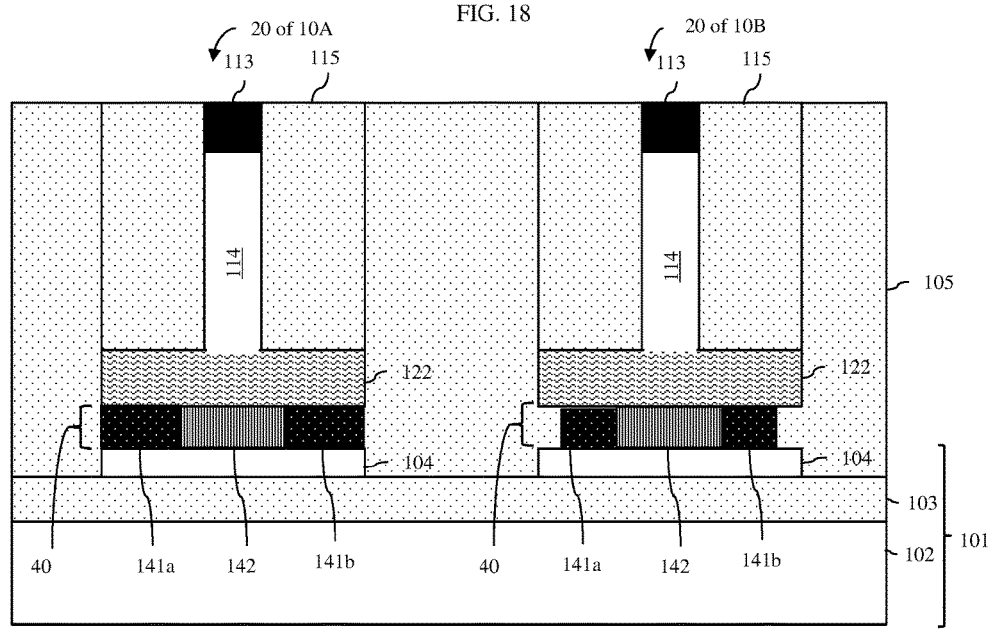
FIGS. 19A-19C are different cross-section diagrams illustrating portions of alternative partially completed structures, respectively, following process 626 of the flow diagram of FIG. 6.
Figure 19B:
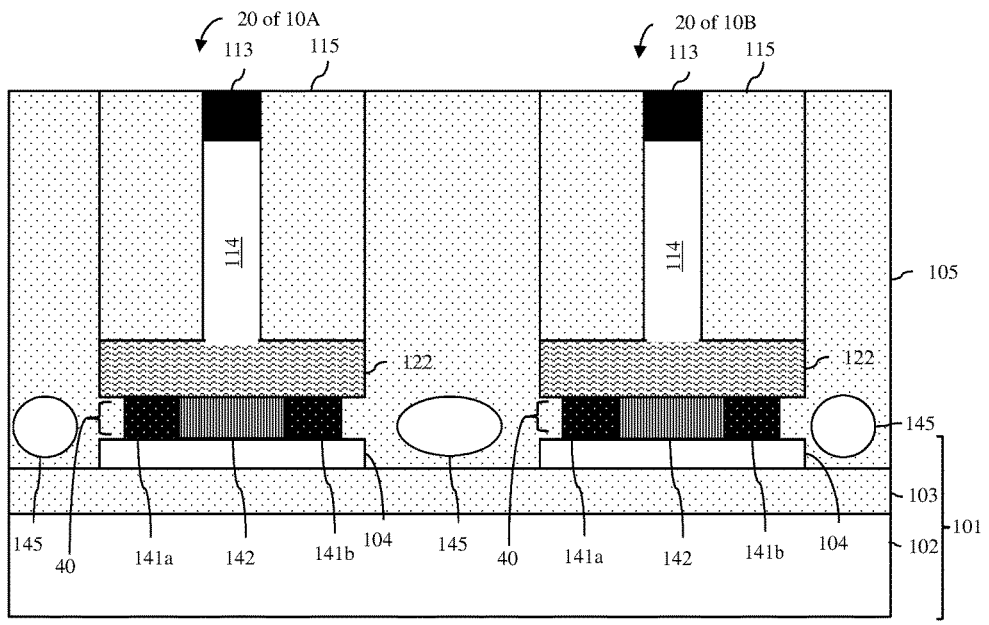
Figure 19C:
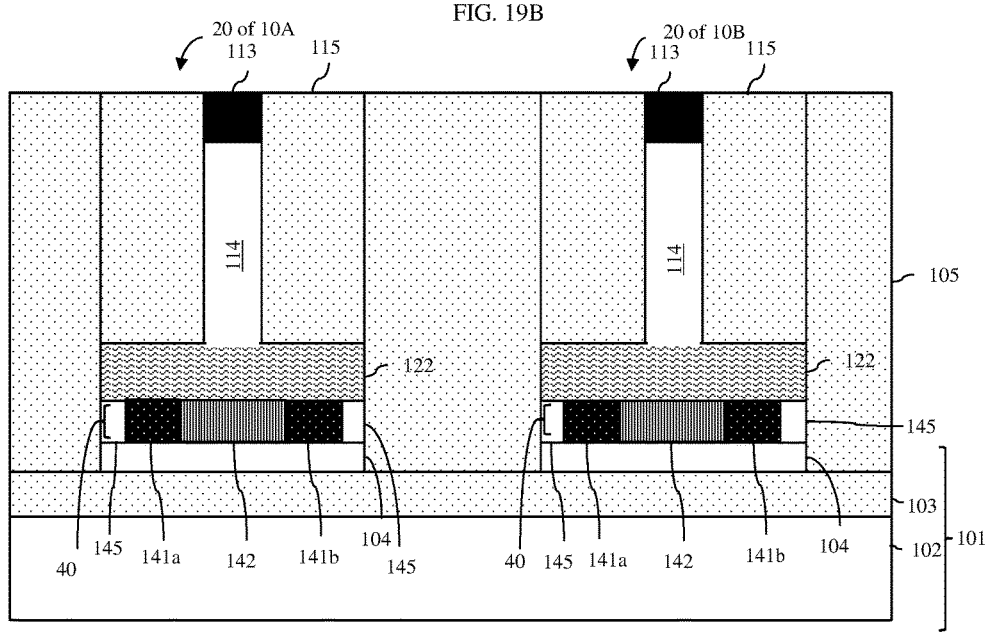

Next, a blanket layer of interlayer dielectric (ILD) material 105 can be deposited such that it fills the additional trenches 167 (see process 626 and FIGS. 19A-19C). Thus, the ILD material 105 will be positioned laterally adjacent to opposing sides of each buried BL 40, each shared first S/D region 122 above each buried BL 40, and the portion of the sacrificial layer 115, which is above each shared first S/D region 122 and which laterally surrounds each semiconductor body 114 thereon. The ILD material 105 can be silicon dioxide. Alternatively, the ILD material 105 can be silane oxide or any other suitable ILD material, such as borophosphosilicate glass (BPSG), tetraethyl orthosilicate (TEOS), fluorinated tetraethyl orthosilicate (FTEOS), etc.

It should be noted that the ILD material 105 could be deposited at process 626 in such a way as to completely fill the additional trenches 167, as shown in FIG. 19A, regardless of whether the buried BLs 40 and shared first S/D regions 122 above have equal widths or not. Alternatively, the ILD material 105 could be deposited at process 626 in such a way that airgaps 145 (also referred to as voids or air pockets) are formed. In one exemplary embodiment, a relatively thick layer of ILD material 105 can be conformally deposited in such a way that it pinches of prior to filling the additional trenches 167, thereby forming airgaps 145 within the ILD material 105 and positioned laterally between adjacent BLs 40, as shown in FIG. 19B, regardless of whether the buried BLs 40 and shared first S/D regions 122 above have equal widths or not. In another exemplary embodiment, when the width 162 of each buried BL 40 is less than the width 161 of the each shared first S/D regions 122 airgaps 145, a non-conformal layer of the ILD material 105 can be deposited such that airgaps 145 are formed below the shared first S/D regions 122 between the sidewalls of the BLs 40 and the ILD material 105 (see FIG. 19C).

For purposes of illustration, unless otherwise noted, the remaining process steps are described below and illustrated in the Figures with respect to the partially completed structure shown in FIG. 19A (wherein the widths of the buried BL 40 and the shared first S/D region 122 above are essentially equal and wherein airgaps 145 are not present). However, it should be understood that these same process steps could, alternatively, be performed with respect to the partially completed structures shown in FIG. 19A or 19B or any alternative structure that is described above but not specifically shown in the Figures.

Subsequently, gate openings 168 for the VFETs 20 of the memory cells in the memory array can be formed in blanket layer of ILD material 105 and the sacrificial layer 115 (see process 628).

Figure 20A:
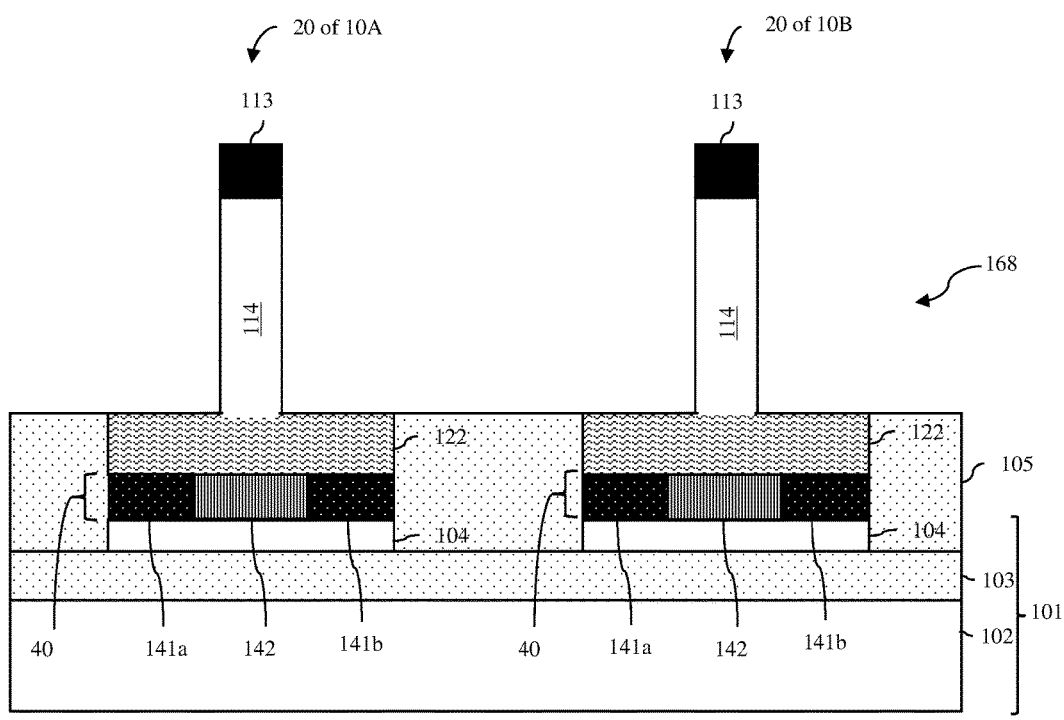
FIGS. 20A and 20B are cross-section and top view diagrams, respectively, illustrating a portion of a partially completed structure formed according to the flow diagram of FIG. 6.
Figure 20B:
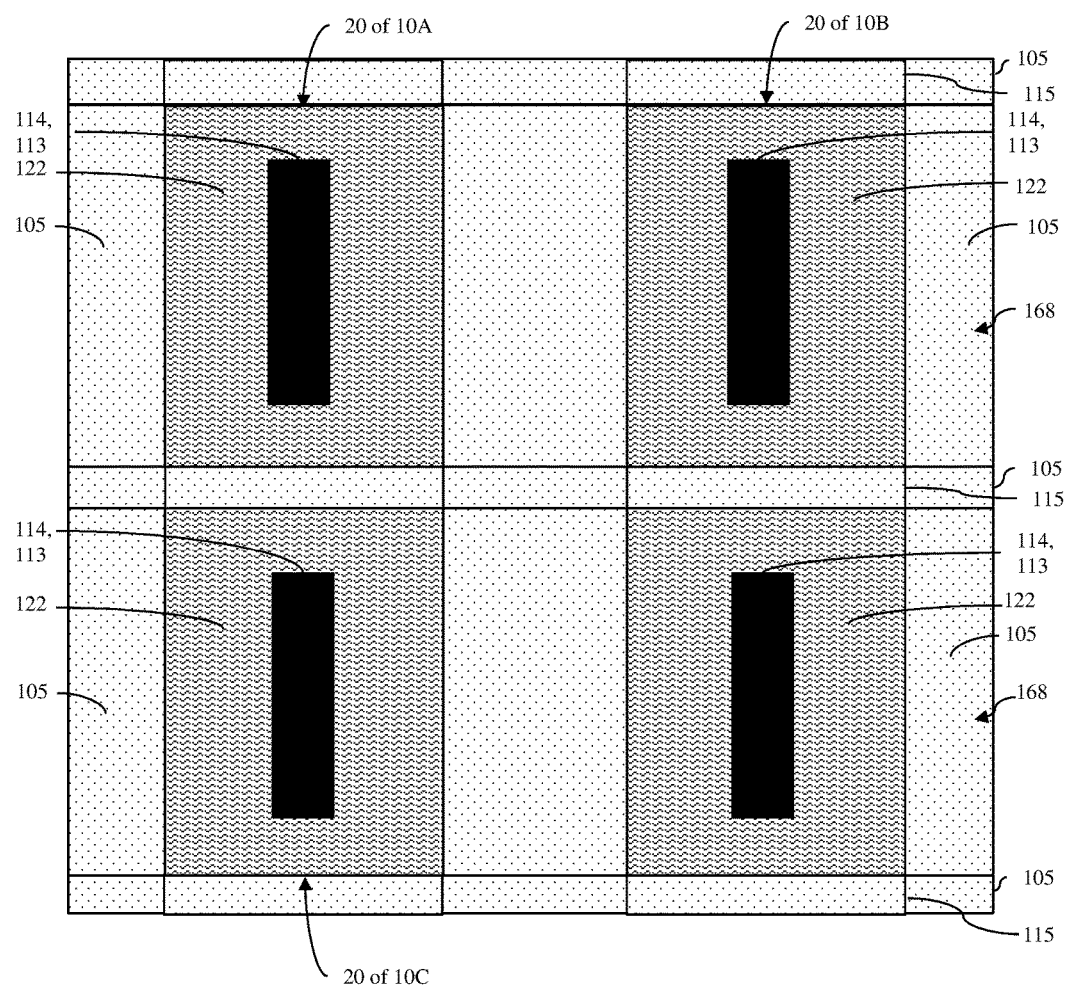

For example, shared gate opening 168 can be formed (e.g., lithographically patterned and etched) into the blanket layer of ILD material 105 and the remaining portions of the sacrificial layer 115, where each shared gate opening 168 will be used to form a shared gate structure for all the VFETs 20 in all the memory cells in a given row of memory cells within the memory array. In this case, the shared gate opening should be patterned and etched so as to expose the vertically surfaces (i.e., sidewalls) of all the semiconductor bodies 114 and the top surfaces of all the first S/D regions 122 of all the VFETs 20 in all the memory cells of a given row within the memory array. FIG. 20A is a cross-section diagram, which shows a portion of a gate opening 168 that exposes the semiconductor bodies 114 and top surfaces of the first S/D regions 122 of the VFETs 20 of adjacent memory cells 10A and 10B. It should be understood that this same shared gate opening 168 would also expose additional semiconductor bodies and top surfaces of first S/D regions of any additional VFETs of any additional memory cells in that same row. FIG. 20B is a top view diagram showing the same shared gate opening 168 as shown in FIG. 20A and also another shared gate opening that exposes the semiconductor bodies 114 and the top surfaces of other first S/D regions 122 of other VFETs 20 in the memory cells of an adjacent row of memory cells within the memory array and, particularly, of a row of memory cells that includes memory cell 10C (which, as shown in FIG. 1 and discussed above, is in the same column with and shares a first S/D region with the memory cell 10A).

Alternatively, discrete gate openings can be formed (e.g., lithographically patterned and etched) into the blanket layer of ILD material 105 and the remaining portions of the sacrificial layer 115 for each VFET 20 of each memory cell in the memory array. In this case, each discrete gate opening will be used to form a discrete gate for each VFET 20 in each memory cell.

Following formation of the gate openings 168, gate-all-around structures 107 can be formed within the gate openings 168 to form a channel region 121 in each semiconductor body 114 (see process 630). For purposes of illustration, the gate formation processes are described below and illustrated in the Figures with respect to forming shared gate-all-around structures 107 in shared gate openings 168, where each shared gate-all-around structure 107 is shared by all the VFETs 20 of all the memory cells in a given row of memory cells in the memory array. It should, however, be understood that essentially the same processes could be used to form discrete gate-all-around structure for each VFET 20 of each memory cell of the memory array.

Figure 21:
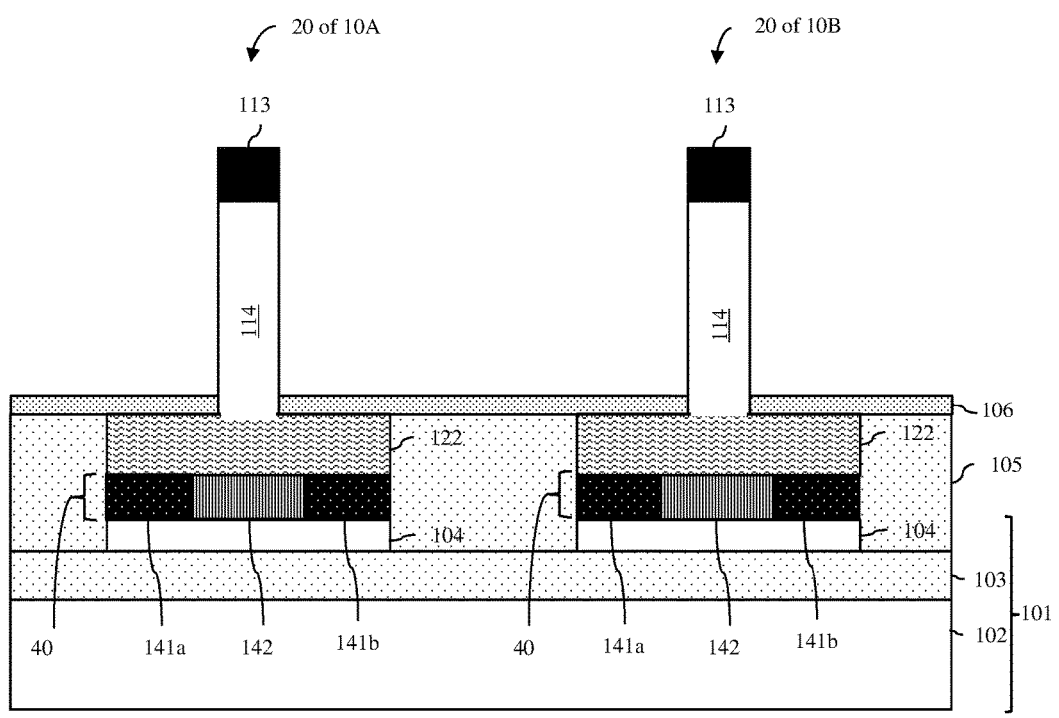
FIG. 21 is a cross-section diagram illustrating a portion of a partially completed structure formed according to the flow diagram of FIG. 6.

Specifically, at process 630, a first spacer layer 106 (i.e., a lower spacer layer) can be deposited, optionally polished, and then etched back so that, within each shared gate opening 168, the first spacer layer 106 covers the exposed top surfaces of the first S/D regions 122 of each VFET 20 of the memory cells in that row and such that the first spacer layer 106 is positioned laterally immediately adjacent to and, more particularly, laterally surrounds the lower end (also referred to herein as the first end) of each semiconductor body 114 of each VFET 20 of the memory cells in that row (see FIG. 21). The first spacer layer 106 can be made of a dielectric spacer material. The dielectric spacer material can be, for example, a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the first spacer layer 106 is hydrogenated silicon oxycarbide (SiOCH). Alternatively, any other suitable dielectric spacer material could be used.

Figure 22:
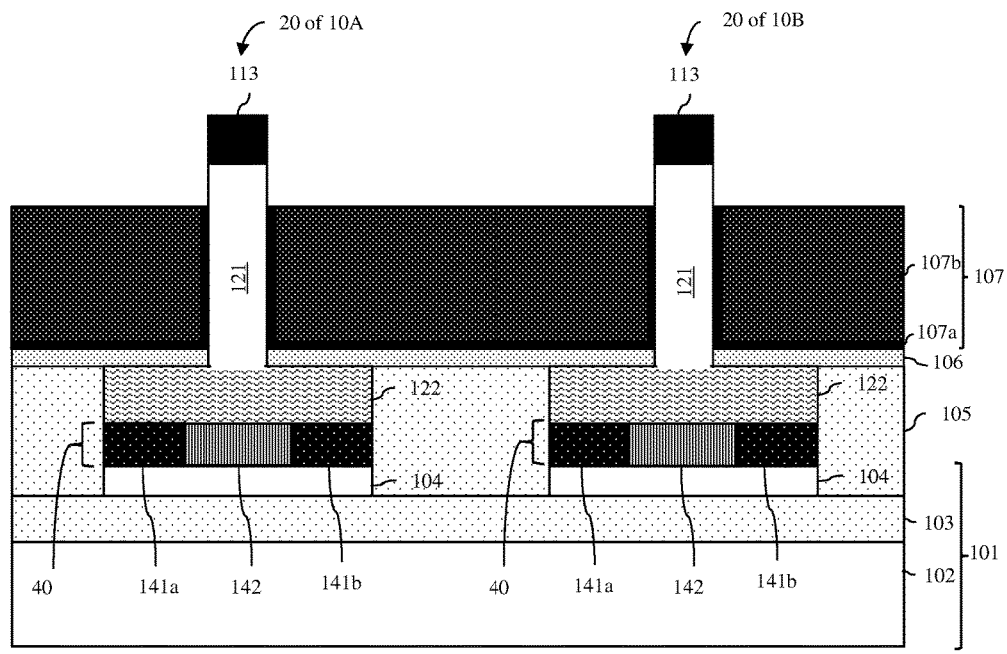
FIG. 22 is a cross-section diagram illustrating a portion of a partially completed structure formed according to the flow diagram of FIG. 6.

Next, gate dielectric and gate conductor layers 107a-107b can be formed on the first spacer layer 106 within each shared gate opening (see FIG. 22).

Specifically, a gate dielectric layer 107a can be formed (e.g., conformally deposited) in each shared gate opening 168 such that the gate dielectric layer 107a covers the top surface of the first spacer layer 106 and the exposed surfaces of the semiconductor bodies 114. The gate dielectric layer 107a can be made, for example, of silicon dioxide or a high-K gate dielectric material. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Techniques for conformally depositing gate dielectric materials are well known in the art and, thus, the details have been omitted from this specification in order to allow the reader to focus on the salient aspects of the disclosed embodiments.

At least one gate conductor layer 107b can be formed on the gate dielectric layer 107a. For example, to form the gate conductor layer 107b, a polysilicon layer can be deposited on the gate dielectric layer 107a and either in situ doped or subsequently implanted to have the appropriate work function. Alternatively, to form the gate conductor layer 107b, a work function metal layer can be conformally deposited on the gate dielectric layer 107a and, optionally, a fill metal can be deposited on the work function metal. It should be noted that the metal or metal alloy material of such a work function metal can be preselected in order to achieve the optimal gate conductor work function given the conductivity type of the VFET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten, aluminum and cobalt.

The gate dielectric and gate conductor layers 107a-b can then be recessed in order to complete the shared gate all-around structures 107 and, thereby form the channel regions 121 for the VFETs 20. Recessing of the gate conductor and dielectric layers 107a-107b should be performed so that sidewalls of the upper ends (also referred to herein as the second ends) of the semiconductor bodies 114 are exposed.

Figure 23:
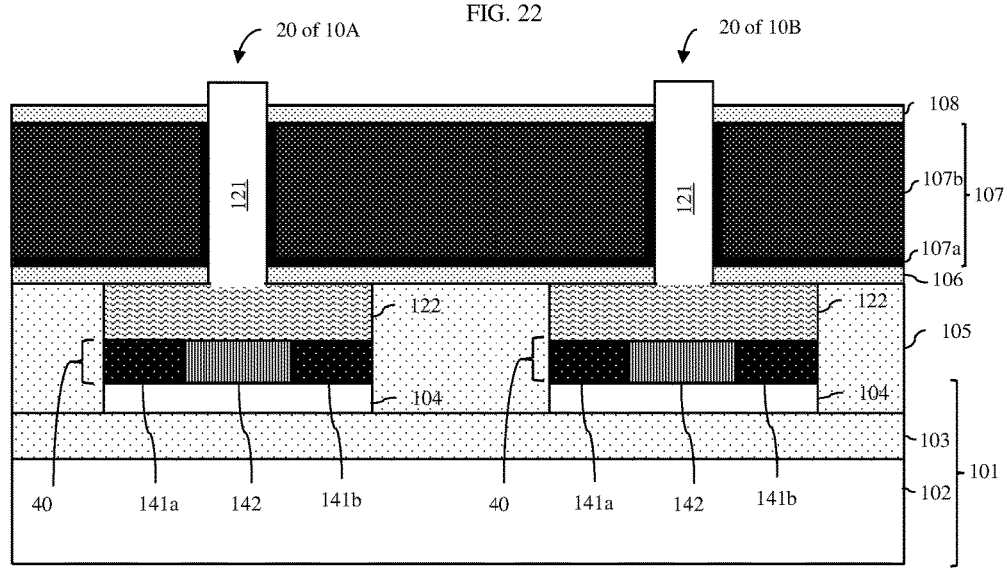
FIG. 23 is a cross-section diagram illustrating a portion of a partially completed structure formed according to the flow diagram of FIG. 6.

A second spacer layer 108 (i.e., an upper spacer layer) can then be deposited on the gate conductor layer 107b, optionally polished, and then etched back so that, within each shared gate opening 168, the top surface of each semiconductor body 114 is exposed, an upper end of each semiconductor body 114 is immediately adjacent to and laterally surrounded by the second spacer layer 108 and the top surface of the gate conductor layer 107b is covered by the second spacer layer 108 (see FIG. 23). The second spacer layer 108 can be made of the same dielectric spacer material as the first spacer layer 106. Alternatively, the second spacer layer 108 could be made of a different dielectric spacer material. It should be noted that, during or after etching back of the second spacer layer 108, the mask sections 113 on the top of the semiconductor bodies 114 can be selectively removed.

Figure 24A:
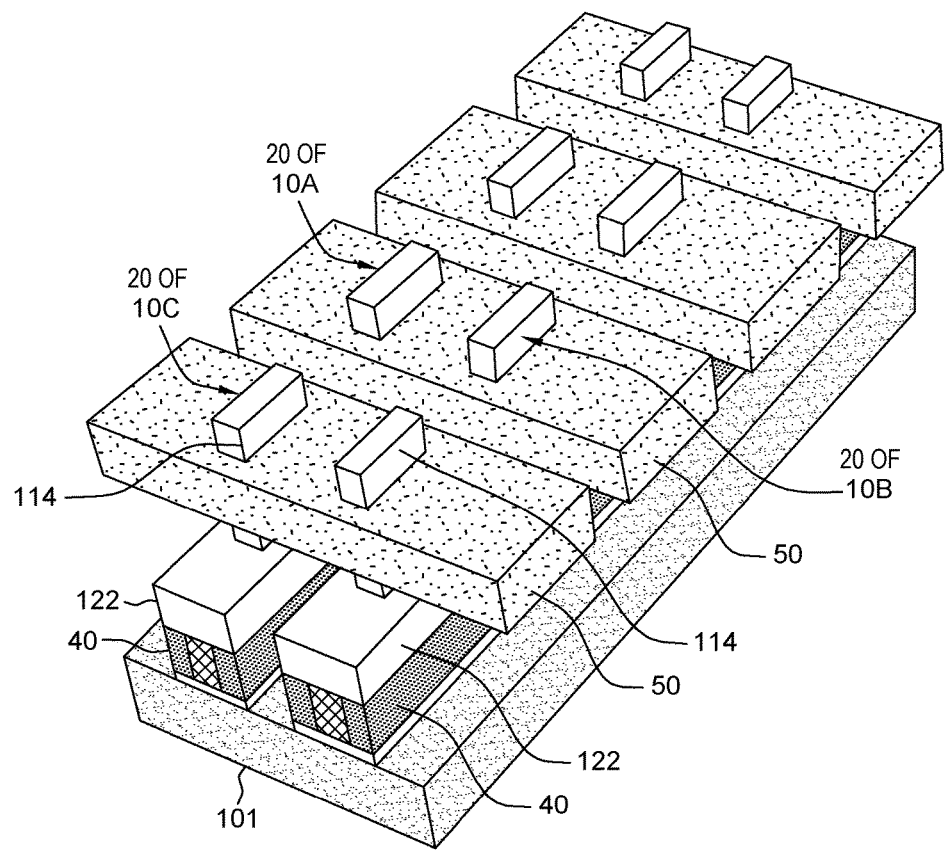
FIGS. 24A-24C are different perspective drawings illustrating portions of alternative partially completed structures with different shaped semiconductor bodies, respectively, following process 630 of the flow diagram of FIG. 6.
Figure 24B:
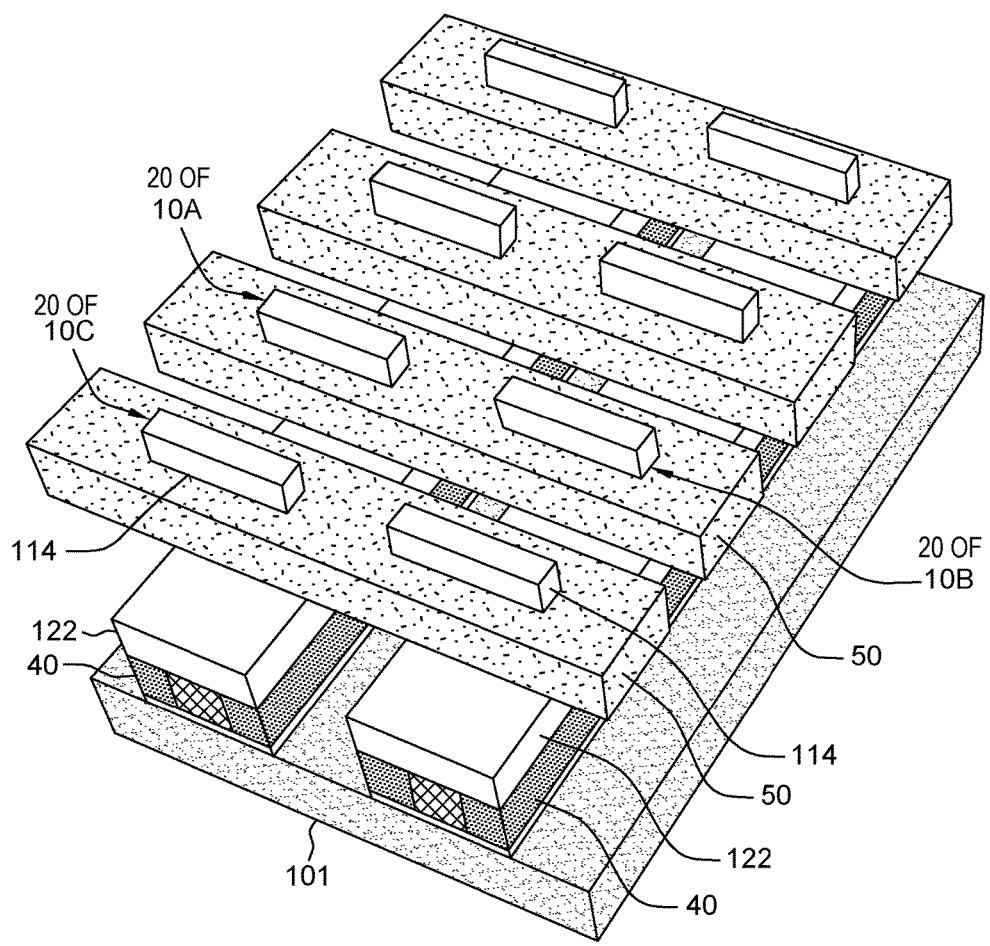
Figure 24C:
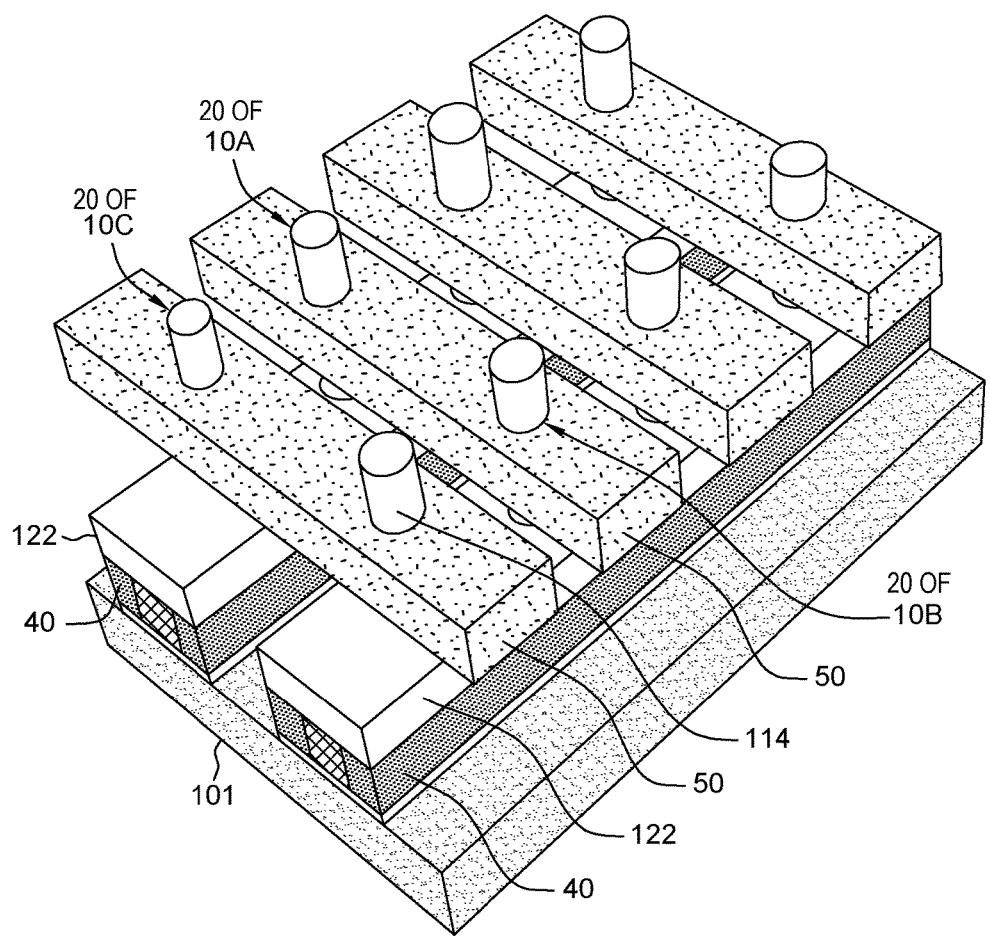

FIGS. 24A-24C are perspective drawings illustrating different embodiments of a partially completed structure formed according to the disclosed method following gate structure formation at process 630. In order to allow for a better understanding of the relative positions of the buried BLs 40, the shared first S/D regions 122, and the shared gate-all-around structure 107 within the memory array several features of these partially completed structures have been left out of the Figures including, but not limited to, the spacer layers, the various different layers of the gate-all-around structures, and the ILD material. The Figures differ simply in the shapes and/or orientations of the semiconductor bodies 114 used. That is, FIG. 24A shows semiconductor bodies 114 patterned as semiconductor fins and oriented in a first direction (i.e. in the same direction as the buried BLs 40). FIG. 24B shows the semiconductor bodies 114 patterned as semiconductor fins and oriented in a second direction that is perpendicular to the first direction (i.e., perpendicular to the buried BLs 40). FIG. 24C shows the semiconductor bodies 114 patterned as semiconductor nanowires (NWs).

Figure 25:
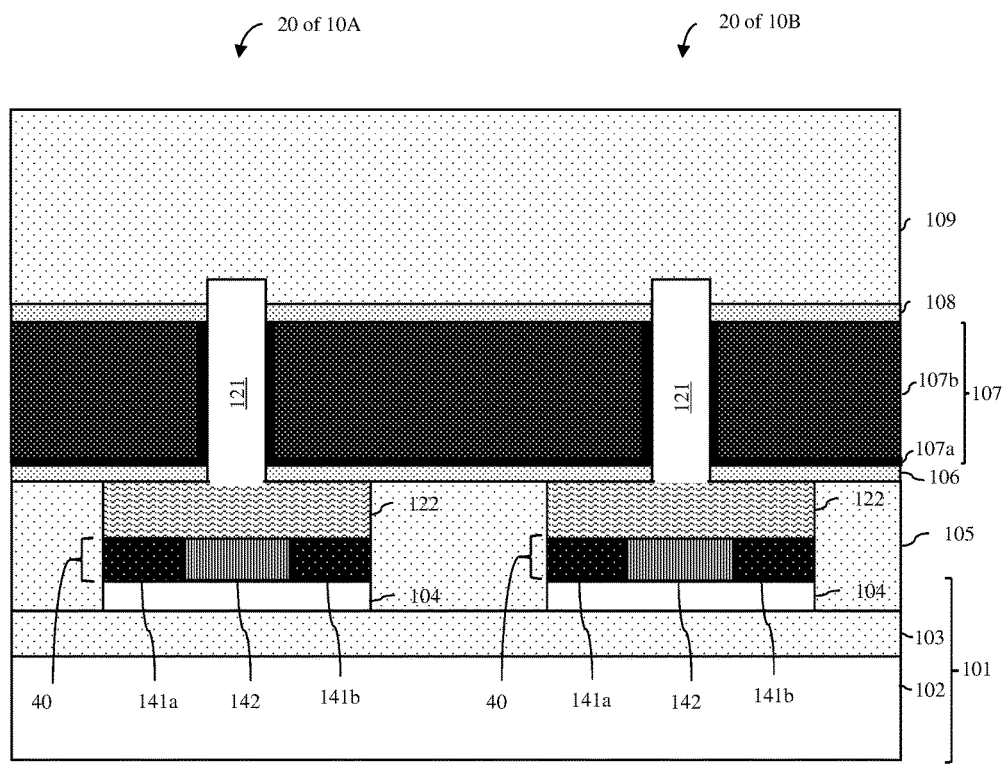
FIG. 25 is a cross-section diagram illustrating a portion of a partially completed structure formed according to the flow diagram of FIG. 6.

A blanket layer of additional ILD material 109 can then be deposited over the partially completed structure (see process 632 and FIG. 25). The blanket layer of additional ILD material 109 will fill any remaining space within the shared gate openings 168 (i.e., will cover the second spacer layer 108, the top surface of the semiconductor bodies 114 and any vertical surfaces of the semiconductor bodies 114 that extend above the second spacer layer 108. The additional ILD material 109 can be the same ILD material as the ILD material 105. Alternatively, the additional ILD material 109 can be a different ILD material. In any case, additional ILD material 109 should be a different material than that used for the second spacer layer 108.

Figure 26:
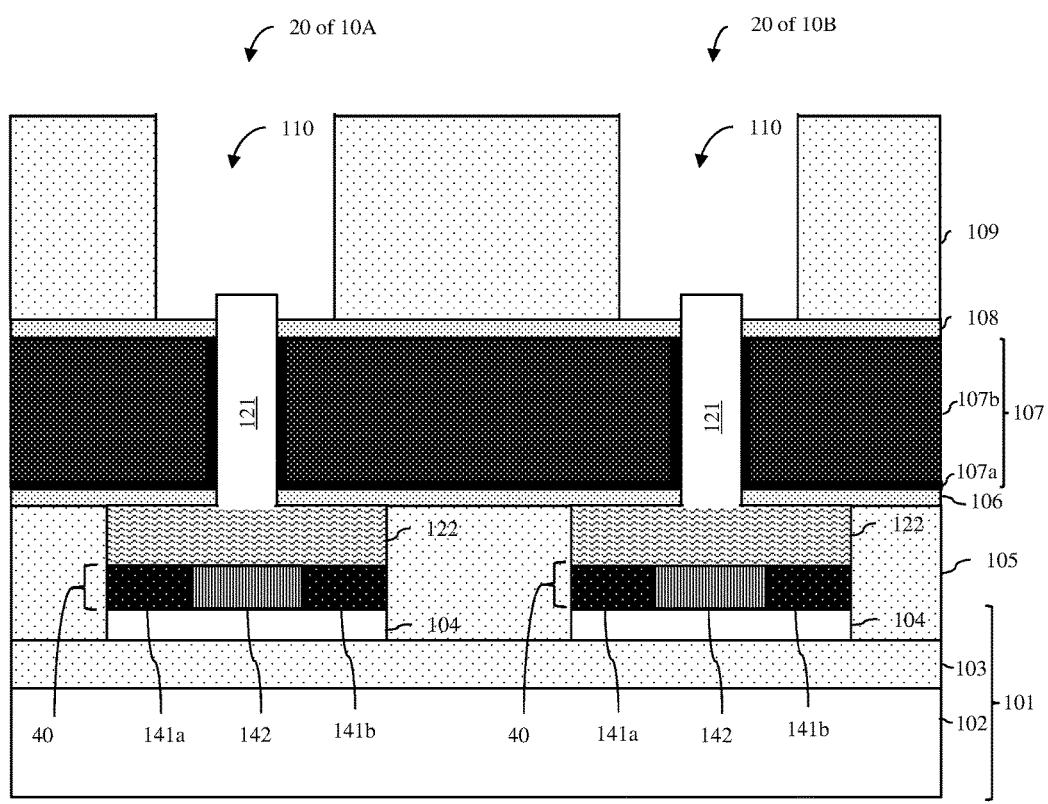
FIG. 26 is a cross-section diagram illustrating a portion of a partially completed structure formed according to the flow diagram of FIG. 6.

Next, S/D openings 110 can be formed in the additional ILD material 109 (see process 634 and FIG. 26). Specifically, the S/D openings 110 can be formed (e.g., lithographically patterned and etched) so that each S/D opening 110 is aligned above the semiconductor body(ies) 114 for a corresponding VFET 20 below and so that each S/D opening 110 extends essentially vertically through the additional ILD material 109 to the top surface of the second spacer layer 108, thereby exposing at least the top surface of the semiconductor body(ies) 114 of that corresponding VFET 20 and any vertical surfaces of the semiconductor body(ies) 114 that extend above the second spacer layer 108.

Figure 27:
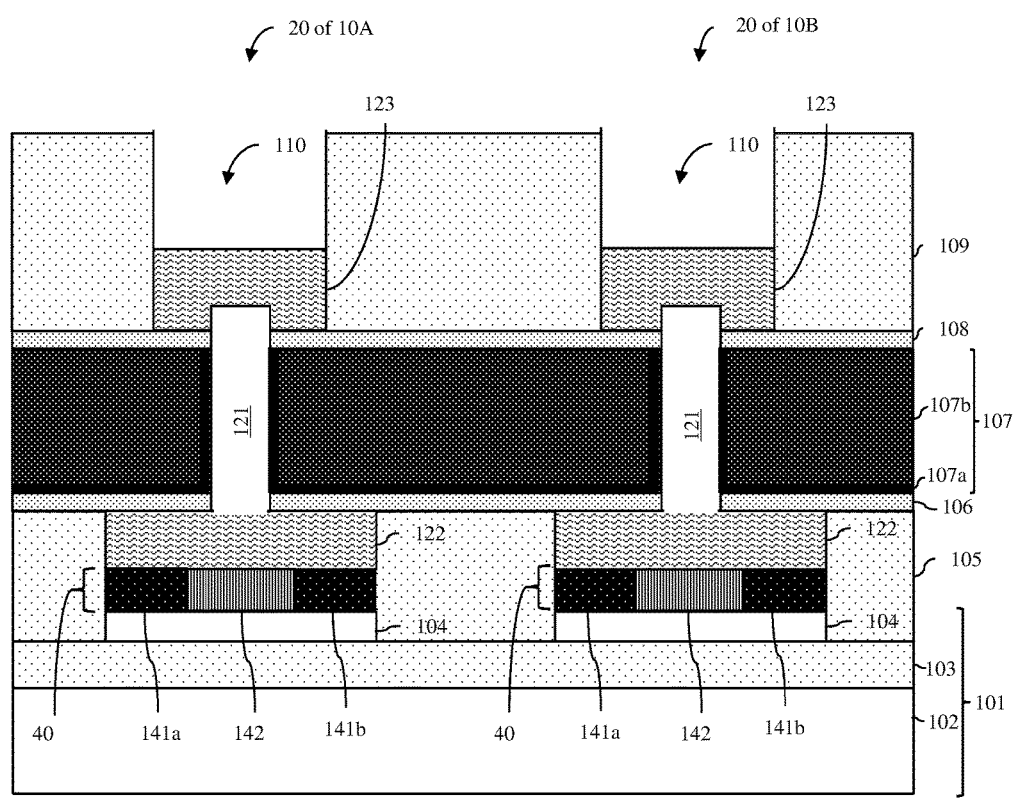
FIG. 27 is a cross-section diagram illustrating a portion of a partially completed structure formed according to the flow diagram of FIG. 6.

Second S/D regions 123 (i.e., upper S/D regions) can be formed in lower portions of the S/D openings 110 (see process 636 and FIG. 27). Specifically, an epitaxial semiconductor material can be grown on the expose semiconductor surfaces of the semiconductor body(ies) within each S/D opening 110 to form the second S/D regions 123. The epitaxial semiconductor material can be the same semiconductor materials as the first semiconductor material (e.g., silicon) or, alternatively, can be a different semiconductor material. In any case, the epitaxial semiconductor material can be in-situ doped so as to have the first-type conductivity at a relatively high conductivity level (e.g., P+ conductivity for a P-type VFET or N+ conductivity for an N-type VFET).

Figure 28:
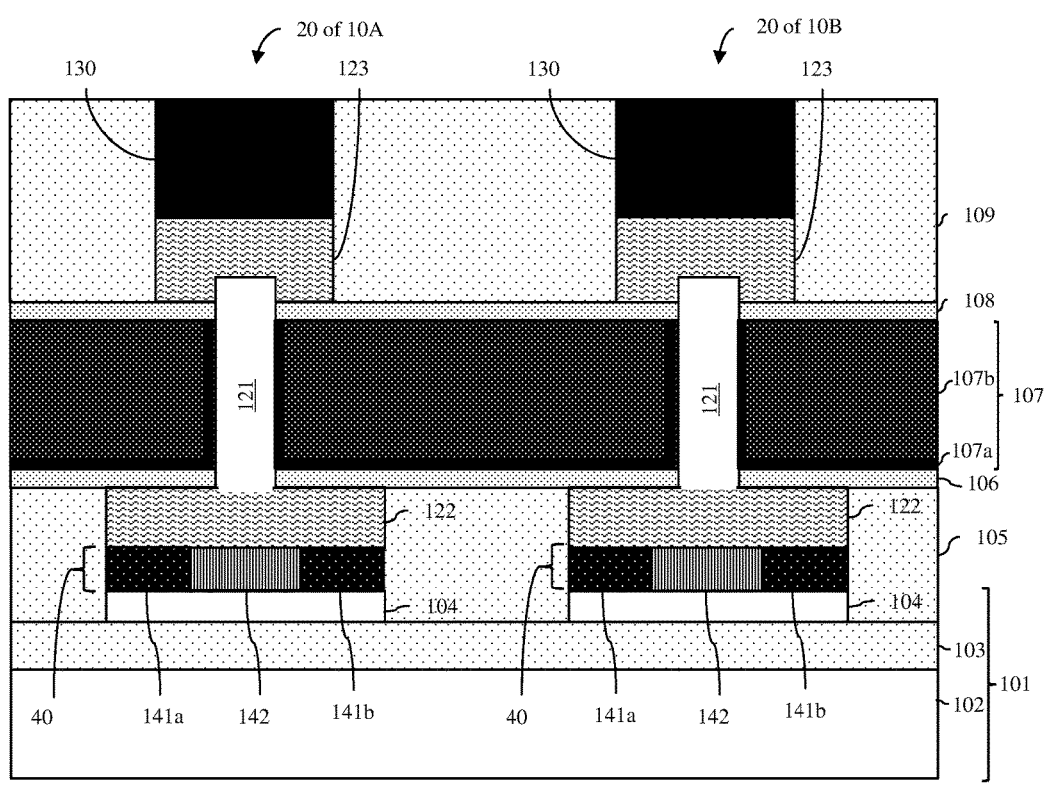
FIG. 28 is a cross-section diagram illustrating a portion of a partially completed structure formed according to the flow diagram of FIG. 6.

S/D contacts 130 can be formed in upper portions of the S/D openings 110 above and immediately adjacent to the second S/D regions 123 (see process 638 and FIG. 28). S/D contact formation processes can include, for example, the formation of a metal silicide layer on the top surface of each second S/D region using a conventional metal salicide process. S/D contact formation processes can further include, but are not limited to, the formation of adhesive and/or barrier layers as well as the deposition of a conductive fill material and, particularly, a metal or metal alloy fill material (e.g., tungsten, cobalt, aluminum, or any other suitable metal or metal alloy fill material). A polishing process (e.g., a CMP process) can then be performed in order to remove any of the contact materials from above the top surface of the additional ILD material 109.

Following formation of the S/D contacts 130, middle of the line (MOL) and back end of the line (BEOL) processing can be performed in order to complete the memory cells and the memory array (see process 640 and FIGS. 1-5). MOL processing can include, but is not limited to: the formation of BL contacts to the buried BLs 40, respectively (e.g., at the end of each column); the formation of gate contacts to the shared gate-all-around structures 107; and the formation of any other MOL components for the memory cells and/or the memory array. BEOL processing can include, but is not limited to: the formation of wires and vias that connect the BL contacts and, thereby the buried BLs, to column address select (CAS) logic; the formation of additional wires and vias for WLs 50 that connect the gate contacts and, thereby the shared gate-all-around structures 107, to row address select (RAS) logic; and the formation of any other BEOL components for the memory cells and/or memory array.

For example, as mentioned above, the memory array being formed according to the disclosed method can be a DRAM array. In this case, each memory cell is a DRAM cell and, particularly, each DRAM cell requires a capacitor 30 that is electrically connected to the second S/D region 123 of the VFET 20 of that DRAM cell through the S/D contact 130. These capacitors 30 can be formed as back end of the line (BEOL) capacitors. That is, the capacitors 30 can be formed within one or more of the BEOL metal levels (M1-Mx) above the VFETs 20 and can be a metal-insulator-metal (MIM), wherein the insulator is positioned laterally between the metals within the same metal level or wherein the insulator is stacked between metals in different metal levels. Techniques for forming such BEOL capacitors are well known in the art and, thus, the details of the techniques have been omitted from the specification in order to allow the reader to focus on the salient aspects of the disclosed embodiments.

The above-described method reduces capacitive coupling between adjacent buried BLs 40 by providing a technique wherein the buried BLs 40 are formed below the first S/D regions 122 of the VFETs 20 of the memory cells as opposed to on the side of those first S/D regions 122. The above-described method also provides optional process steps including, narrowing the BLs 40 and/or forming airgaps 145 adjacent to the buried BLs 40, that can further reduce capacitive coupling between adjacent buried BLs 40.

In the structure and method embodiments described above, the VFETs 20 can be N-type VFETs or P-type VFETs. As discussed, for an N-type VFET, the channel region can have P-type conductivity (or can be undoped) and the S/D regions can have N-type conductivity; whereas, for a P-type VFET, the channel region can have N-type conductivity (or can be undoped) and the S/D regions can have P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a memory array wherein lower source/drain regions of vertical field effect transistors (VFETs) of memory cells in the array are aligned above and electrically connected to buried bitlines. Specifically, each memory cell can include a VFET with a lower source/drain (S/D) region, an upper S/D region and at least one channel region extending vertically between the lower and upper S/D regions. The lower S/D region can be above and immediately adjacent to a buried bitline (BL). This buried BL can have the same width or a narrower width than the lower S/D region. Additionally, this buried BL can include a pair of essentially parallel, elongated, BL sections that extend the length of the buried BL and a semiconductor region positioned laterally between the BL sections. The semiconductor region can be made of a different semiconductor material than the lower S/D region. Also disclosed above are embodiments of a method of forming such a memory array. In this method, because the buried BLs are not lithographically patterned, the desired critical dimension for the BLs can be achieved. Additionally, because the buried BLs are below the lower S/D regions as opposed to beside the lower S/D regions, size scaling of the memory array can occur with minimal BL coupling.

What is claimed is:

1. A memory array comprising:
   a substrate;
   a bitline comprising parallel bitline sections and a semiconductor region positioned laterally between the bitline sections, the bitline having a first surface adjacent to the substrate and comprising essentially co-planar bottom surfaces of the bitline sections and the semiconductor region and a second surface opposite the first surface and comprising essentially co-planar top surfaces of the bitline sections and the semiconductor region; and
   a memory cell comprising a vertical field effect transistor, the vertical field effect transistor comprising a first source/drain region,
   the first source/drain region having a planar bottom surface immediately adjacent to the second surface such that the bitline is stacked between the substrate and the first source/drain region,
   the first source/drain region having a first width,
   the bitline having a second width that is equal to or less than the first width, and
   the first source/drain region being essentially center-aligned above the bitline such that the first source/drain region completely traverses the bitline and such that the planar bottom surface of the first source/drain region is in direct contact with the co-planar top surfaces of the bitline sections and the semiconductor region.

2. The memory array of claim 1,
   the first source/drain region comprising a first semiconductor material,
   the bitline having a length,
   the bitline sections comprising a pair of essentially parallel, elongated, bitline sections extending the length of the bitline and comprising a first bitline section and a second bitline section,
   the semiconductor region being positioned laterally between the first bitline section and the second bitline section,
   the semiconductor region and the first source/drain region being in discrete semiconductor layers, and
   the semiconductor region comprising a second semiconductor material that is different from the first semiconductor material.

3. The memory array of claim 2, the first semiconductor material comprising silicon and the second semiconductor material comprising silicon germanium.

4. The memory array of claim 1, the vertical field effect transistor further comprising:
   a channel region on the first source/drain region such that the first source/drain region is stacked between the bitline and the channel region, the channel region comprising any of a semiconductor fin and a semiconductor nanowire;
   a second source/drain region on the channel region such that the channel region extends essentially vertically between the first source/drain region and the second source/drain region;
   a gate laterally surrounding the channel region between the first source/drain region and the second source/drain region; and
   spacer layers electrically isolating the gate from the first source/drain region and the second source/drain region.

5. The memory array of claim 4, further comprising rows and columns of memory cells, the memory cells comprising vertical field effect transistors, respectively, wherein all the vertical field effect transistors of the memory cells in a given row have a shared gate for a wordline and wherein all the vertical field effect transistors of the memory cells in a given column have a shared bitline.

6. The memory array of claim 1, further comprising interlayer dielectric material positioned laterally adjacent to the bitline and the first source/drain region, wherein an airgap is located between the bitline and the interlayer dielectric material.

7. A memory array comprising:
   an isolation layer on a substrate;
   a semiconductor layer on the isolation layer and comprising a first semiconductor material;
   a bitline on the semiconductor layer and comprising parallel bitline sections and a semiconductor region positioned laterally between the bitline sections, the semiconductor region comprising a second semiconductor material that is different from the first semiconductor material and the bitline having a first surface immediately adjacent to the semiconductor layer and comprising essentially co-planar bottom surfaces of the bitline sections and the semiconductor region and a second surface opposite the first surface and comprising essentially co-planar top surfaces of the bitline sections and the semiconductor region; and
   a memory cell comprising a vertical field effect transistor, the vertical field effect transistor comprising a first source/drain region comprising the first semiconductor material,
   the first source/drain region having a planar bottom surface immediately adjacent to the second surface such that the bitline is stacked between the substrate and the first source/drain region,
   the first source/drain region having a first width,
   the bitline having a second width that is less than the first width, and
   the first source/drain region being essentially center-aligned above the bitline such that the first source/drain region completely traverses the bitline and such that the planar bottom surface of the first source/drain region is in direct contact with the co-planar top surfaces of the bitline sections and the semiconductor region.

8. The memory array of claim 7,
   the bitline having a length,
   the bitline sections comprising a pair of essentially parallel, elongated, bitline sections extending the length of the bitline and comprising a first bitline section and a second bitline section, and
   the semiconductor region being positioned laterally between the first bitline section and the second bitline section.

9. The memory array of claim 7, the bitline sections comprising metal, the first semiconductor material comprising silicon and the second semiconductor material.

10. The memory array of claim 7, the vertical field effect transistor further comprising:
    a channel region on the first source/drain region such that the first source/drain region is stacked between the bitline and the channel region, the channel region comprising any of a semiconductor fin and a semiconductor nanowire;
    a second source/drain region on the channel region such that the channel region extends essentially vertically between the first source/drain region and the second source/drain region;
    a gate laterally surrounding the channel region between the first source/drain region and the second source/drain region; and spacer layers electrically isolating the gate from the first source/drain region and the second source/drain region.

11. The memory array of claim 10, further comprising rows and columns of memory cells, the memory cells comprising vertical field effect transistors, respectively, wherein all the vertical field effect transistors of the memory cells in a given row have a shared gate for a wordline and wherein all the vertical field effect transistors of the memory cells in a given column have a shared bitline.

12. The memory array of claim 7, further comprising interlayer dielectric material positioned laterally adjacent to the bitline and the first source/drain region, wherein an airgap is located either within the interlayer dielectric material or between the bitline and the interlayer dielectric material.

13. A memory array comprising:
    an isolation layer on a substrate;
    a silicon layer on the isolation layer;
    a bitline on the silicon layer and comprising parallel bitline sections and a silicon germanium region positioned laterally between the bitline sections, the bitline having a first surface immediately adjacent to the silicon layer comprising essentially co-planar bottom surfaces of the bitline sections and the silicon germanium region and a second surface opposite the first surface and comprising essentially co-planar top surfaces of the bitline sections and the silicon germanium region; and
    a memory cell comprising a vertical field effect transistor, the vertical field effect transistor comprising a first source/drain region comprising silicon,
    the first source/drain region having a planar bottom surface immediately adjacent to the second surface such that the bitline is stacked between the silicon layer and the first source/drain region,
    the first source/drain region having a first width,
    the bitline having a second width that is less than the first width, and
    the first source/drain region being essentially center-aligned above the bitline such that the first source/drain region completely traverses the bitline and such that the planar bottom surface of the first source/drain region is in direct contact with the co-planar top surfaces of the bitline sections and the silicon germanium region.

14. The memory array of claim 13,
    the bitline having a length,
    the bitline sections comprising a pair of essentially parallel, elongated, bitline sections extending the length of the bitline and comprising a first bitline section and a second bitline section, and
    the silicon germanium region being positioned laterally between the first bitline section and the second bitline section.

15. The memory array of claim 13, the bitline sections comprising any of tungsten, titanium, titanium nitride, tantalum, tantalum nitride, cobalt, and nickel.

16. The memory array of claim 13, the vertical field effect transistor further comprising:
    a channel region on the first source/drain region such that the first source/drain region is stacked between the bitline and the channel region, the channel region comprising any of a silicon fin and a silicon nanowire;
    a second source/drain region on the channel region such that the channel region extends essentially vertically between the first source/drain region and the second source/drain region;
    a gate laterally surrounding the channel region between the first source/drain region and the second source/drain region; and
    spacer layers electrically isolating the gate from the first source/drain region and the second source/drain region.

17. The memory array of claim 16, further comprising rows and columns of memory cells, the memory cells comprising vertical field effect transistors, respectively, wherein all the vertical field effect transistors of the memory cells in a given row have a shared gate for a wordline and wherein all the vertical field effect transistors of the memory cells in a given column have a shared bitline.

18. The memory array of claim 13, further comprising interlayer dielectric material positioned laterally adjacent to the bitline and the first source/drain region, wherein an airgap is located either within the interlayer dielectric material or between the bitline and the interlayer dielectric material.

* * * * *